(12) United States Patent
Deguchi et al.

(10) Patent No.: US 7,288,797 B2
(45) Date of Patent: Oct. 30, 2007

(54) SEMICONDUCTOR LIGHT EMITTING ELEMENT

(75) Inventors: Koichiro Deguchi, Anan (JP); Hisashi Kasai, Anan (JP); Takeshi Kususe, Anan (JP); Koji Honjo, Anan (JP); Takao Yamada, Anan (JP)

(73) Assignee: Nichia Corporation, Anan-shi (JP)

( * ) Notice: Subject to any disclaimer, the term of this patent is extended or adjusted under 35 U.S.C. 154(b) by 28 days.

(21) Appl. No.: 10/905,759

(22) Filed: Jan. 19, 2005

(65) Prior Publication Data

US 2005/0156189 A1 Jul. 21, 2005

(30) Foreign Application Priority Data

Jan. 20, 2004 (JP) ............................. 2004-012370
Mar. 30, 2004 (JP) ............................. 2004-100622

(51) Int. Cl.
*H01L 29/22* (2006.01)
(52) U.S. Cl. ................................. 257/99; 257/E33.034
(58) Field of Classification Search .................. 257/99
See application file for complete search history.

(56) References Cited

U.S. PATENT DOCUMENTS 6,847,056 B2  1/2005  Noto et al.
2002/0063256 A1*  5/2002  Lin ............................. 257/79
2004/0056267 A1   3/2004  Asatsuma et al.
2004/0061101 A1   4/2004  Noto et al.
2004/0206961 A1* 10/2004  Yamada et al. ............... 257/79
2005/0082562 A1*  4/2005  Ou et al. ..................... 257/103

FOREIGN PATENT DOCUMENTS

| JP | A-H06-188455 | 7/1994 |
| JP | A-H10-242587 | 9/1998 |
| JP | A-2000-164922 | 6/2000 |
| JP | A-2001-196633 | 7/2001 |
| JP | A-2002-232005 | 8/2002 |
| JP | A-2003-101071 | 4/2003 |
| JP | A-2003-124518 | 4/2003 |
| JP | A-2003-347238 | 12/2003 |
| JP | A-2004-165654 | 6/2004 |

OTHER PUBLICATIONS

Margalith et al. "Indium Tin Oxide contacts to gallium nitride optoelectronic devices" Applied Physics Letter 74,3930, 1999.*

* cited by examiner

*Primary Examiner*—B. William Baumeister
*Assistant Examiner*—Matthew L. Reames
(74) *Attorney, Agent, or Firm*—Global IP Counselors, LLP

(57) ABSTRACT

A semiconductor light emitting element includes an conductive oxide film containing at least one element selected from the group consisting of zinc, indium, tin, and magnesium that is electrically connected to the semiconductor layer. The conductive oxide film includes a plurality of voids in the vicinity of the interface with the semiconductor layer.

42 Claims, 23 Drawing Sheets

SEMICONDUCTOR LIGHT EMITTING ELEMENT

BACKGROUND OF THE INVENTION

1. Field of the Invention

The present invention relates to a semiconductor light emitting element having a transparent conductive oxide film as an electrode.

2. Background Information

Semiconductor light emitting elements having a p-type semiconductor layer and an n-type semiconductor layer laminated onto a substrate, and electrodes that are electrically connected to the respective p-type and n-type semiconductor layers, are well known in the prior art. In addition, as the electrode that is electrically connected to the p-type semiconductor layer, a structure in which an electrode made of a transparent material is formed on the entire surface of the p-type semiconductor layer and a metal electrode is formed thereon, is well known.

With semiconductor light emitting elements having this type of structure, in order to improve light extraction efficiency, a transparent metal thin film, or a conductive oxide film of ITO, ZnO, $In_2O_3$ or the like, is employed as the electrode formed on the entire surface of the p-type semiconductor layer (see, for example, JP-A-2001-196633).

However, because a conductive oxide film, e.g., ITO, exhibits n-type semiconductor characteristics, the ohmic characteristics with the semiconductor layer will not necessarily be good, and because of various factors such as the composition of semiconductor layer, the conductive type, the film formation method, and the like, a Schottky barrier will be formed, and contact resistance will increase. Thus, there will be problems such as restrictions on the conditions under which the semiconductor layer and the conductive oxide film are formed, and the impurity concentration, the conductive type, and the like, or a decline in electrical energy conversion efficiency or light extraction efficiency due to a worsening of the ohmic characteristics toward the semiconductor layer of the conductive oxide film.

The present invention takes the aforementioned problems into consideration, and aims to provide a semiconductor light emitting element having a transparent conductive oxide film on a semiconductor layer, and which is comprised of an electrode that can maintain sufficient transparency and improve light emission efficiency while reducing the Schottky barrier between the semiconductor layer and the conductive oxide film, reduce contact resistance to a minimum, and achieve an excellent ohmic contact.

SUMMARY OF THE INVENTION

A semiconductor light emitting element according to a first aspect of the present invention comprises an conductive oxide film that is electrically connected to a semiconductor layer, the conductive oxide film containing at least one element selected from the group consisting of zinc, indium, tin, and magnesium as a constituent element. The conductive oxide film includes a plurality of voids in the vicinity of the interface with the semiconductor layer.

With this semiconductor light emitting element, it is preferable that the density of the conductive oxide film on the semiconductor layer side be lower than that on the surface side.

In addition, it is also preferable that the conductive oxide film does not have voids on the surface side thereof.

Furthermore, it is also preferable that the surface side of the conductive oxide film is flat.

A semiconductor light emitting element according to a second aspect of the present invention comprising a conductive oxide film electrically connected to a semiconductor layer, the conductive oxide film containing at least one element selected from the group consisting of zinc, indium, tin, and magnesium as a constituent element. The conductive oxide film has pits and/or projections on the surface of the semiconductor layer side, the projections are in contact with the semiconductor layer, the pits constitute voids therein, and the surface opposite the semiconductor layer side is flat.

In addition, it is also preferable that the conductive oxide film of the first or second aspect is an oxide film further comprising a trace amount of an element different than the constituent element.

Furthermore, it is also preferable that the trace element is at least one element selected from tin, zinc, gallium, and aluminum.

In addition, it is also preferable that the oxide film contains the trace element in an amount 20% or less of the constituent element other than oxygen.

Furthermore, it is also preferable that the concentration of the trace element of the conductive oxide film in the vicinity of the interface with the semiconductor layer is higher than the concentration of the trace element in the vicinity of the surface opposite the interface.

In addition, it is also preferable that the concentration of the trace element of the conductive oxide film steadily decreases from the semiconductor layer side surface to the opposite surface.

In addition, the conductive oxide film of the first or second aspect is preferably an ITO film.

Furthermore, it is preferable that the light transmissivity of the conductive oxide film of the first or second aspect is 80% or higher, or that the specific resistance of the conductive oxide film of the first or second aspect is $1 \times 10^{-4}$ $\Omega$(ohm) cm or less.

In addition, the plurality of voids preferably make up 10 to 50% of the entire thickness of the conductive oxide film from the semiconductor layer side.

Furthermore, it is preferable that the thickness of the conductive oxide film of the first or second aspect is 100 nm or greater.

In addition, the semiconductor light emitting element of the first or second aspect is formed by laminating a first conductive type semiconductor layer, a light emitting layer, and a second conductive type semiconductor layer in this order, and includes electrodes that are respectively electrically connected to the first conductive type and the second conductive type semiconductor layers. The conductive oxide film is preferably formed on at least the second conductive type semiconductor layer.

Furthermore, it is preferable that the first conductive type semiconductor layer is an n-type semiconductor layer, and the second conductive type semiconductor layer is a p-type semiconductor layer.

Furthermore, it is preferable that the semiconductor light emitting element of the first or second aspect is formed by laminating a first conductive type semiconductor layer, a light emitting layer, and a second conductive type semiconductor layer in this order, and that electrodes are respectively connected to the first conductive type and second conductive type semiconductor layers. The first conductive type semiconductor layer is preferably an n-type nitride semiconductor layer, the second conductive type semiconductor layer is preferably a p-type nitride semiconductor layer, and the p-type nitride semiconductor layer is preferably in contact with the conductive oxide film as a p-type contact layer and has a thickness of 250 Å or less and an Mg concentration of $1.5\times10^{20}/cm^3$ or greater.

Furthermore, it is preferable that the surface of the p-type contact layer has an RMS surface roughness of 3 nm or less.

In addition, it is preferable that a metal film be formed on the conductive oxide film of the first or second aspect, or that a single or laminated metal film or an alloy of W, Rh, Ag, Pt, Pd, Al, or Ti be formed on the conductive oxide film of the first or second aspect.

Furthermore, the semiconductor layers of the first or second aspect are preferably nitride semiconductor layers.

A method of producing a semiconductor light emitting element according to a third aspect of the present invention is disclosed in which a conductive oxide film is electrically connected to a semiconductor layer, and the conductive oxide film contains at least one element selected from the group consisting of zinc, indium, tin, and magnesium. The method comprises the steps of:

(1) forming a conductive oxide film having voids from the semiconductor layer side to the surface; and (2) forming a conductive oxide layer on the conductive oxide layer obtained in step (1) which has no voids or fewer voids than that of step (1).

A method of producing a semiconductor light emitting element according to a fourth aspect of the present invention is disclosed in which a conductive oxide film is electrically connected to a semiconductor layer, and the conductive oxide film contains at least one element selected from the group consisting of zinc, indium, tin, and magnesium. The method comprises the steps of:

(1) forming a conductive oxide film; and (2) heating the conductive oxide film, providing voids on the semiconductor layer side of the conductive oxide film and the vicinity thereof, and flattening the surface side thereof.

In addition, it is preferable that the crystallization of the conductive oxide film of the fourth aspect be accelerated by heating the conductive oxide film.

Furthermore, it is preferable that the conductive oxide film of the third or fourth aspect is an oxide film containing at least one element selected from the group comprising zinc, indium, tin, and magnesium, and a trace element that is different from the constituent element.

In addition, it is preferable that the trace element is at least one element selected from tin, zinc, gallium, and aluminum.

Furthermore, it is preferable that the conductive oxide film of the third or fourth aspect is an ITO film.

In addition, it is preferable that the voids make up 10 to 50% of the entire thickness of the conductive oxide film of the third or fourth aspect from the semiconductor layer side.

Furthermore, it is preferable that the semiconductor layer of the third or fourth aspect is a nitride semiconductor.

In addition, it is preferable that the semiconductor layer of the third or fourth aspect is a p-type nitride semiconductor.

According to the semiconductor light emitting element of the present invention, the conductive oxide film includes a plurality of voids in the vicinity of the interface with the semiconductor layer, i.e., the density on the semiconductor layer side is lower than the surface side, and thus the contact surface area of the conductive oxide film and the semiconductor layer is reduced. However, because the crystallinity of the conductive oxide film is excellent, the Schottky barrier can be reduced, and the ohmic characteristics can be improved. Thus, the electrical power efficiency can be improved. Moreover, in particular, because there are no voids on the surface side of the conductive oxide film, and a high density region having excellent crystallinity will be present, electric current can spread uniformly in the horizontal direction, light diffusion can be prevented, transmissivity with respect to visible light can be made excellent, and can be made to exhibit sufficient transparent electrode functions.

In addition, when the conductive oxide film is an ITO film, the aforementioned effects can be more reliably exhibited.

Furthermore, when the light transmissivity of the conductive oxide film at 400 to 600 nm is 80% or greater, the desired light generated from the semiconductor light emitting element can be more efficiently extracted, and is thus advantageous.

In addition, when the specific resistance of the conductive oxide film is $1\times10^{-4}$ Ωcm or less, the electric current input into the conductive oxide film can be more efficiently diffused in the semiconductor layer, electrical power efficiency can be improved even more, and accordingly the light extraction efficiency will be made more excellent.

When the plurality of voids make up 10 to 50% of the entire thickness of the conductive oxide film from the semiconductor layer side, the electric current that passes through the conductive oxide film will not be hindered on the surface side, and resistance can be reduced even more.

When the semiconductor light emitting element is formed by laminating a first conductive type semiconductor layer, a light emitting layer, and a second conductive type semiconductor layer in this order, and includes electrodes that are respectively electrically connected to the first conductive type and the second conductive type semiconductor layers, and the conductive oxide film is formed on at least the second conductive type semiconductor layer, a bright light emitting element which can prevent a reduction in electrical power efficiency and which has low energy consumption can be provided because electrodes having superior ohmic characteristics can be obtained. Moreover, because the ohmic characteristics can be secured while maintaining excellent transmissivity, the light extraction efficiency can be made excellent, and a high quality and high performance light emitting element can be obtained.

When a metal film is also formed on the conductive oxide film, particularly when a single layer or laminated metal film of W, Rh, Ag, Pt, Pd, or Al is formed thereon, the Schottky barrier formed between the conductive oxide film and the metal film can be reduced, and excellent adhesiveness with the metal film can be secured regardless of whether the adhesion is performed by soldering, whether wire bonding is performed, or regardless of the form of the metal film. From amongst these, when W, Rh, or Pt are employed as the metal film, the adhesiveness with the conductive oxide film, and particularly with an ITO film, will be especially good, and the reliability of the electrical connection can be improved.

In addition, the contact resistance with the semiconductor layer can be reduced by grading the composition of the conductive oxide film.

Furthermore, by setting the thickness of the p-type contact layer to 250 Å or less, and the Mg density thereof to $1.5\times10^{20}/cm^3$ or greater, a semiconductor light emitting element can be obtained which comprises a contact layer in which the ohmic characteristics thereof with respect to the positive electrode are superior, and in which the contact resistance thereof is reduced. In addition, the time needed for the deposition, heat treatment, and the like of the contact layer can be shortened, the production process can be simplified, the repeatability of the process can be improved, and a high quality semiconductor light emitting element can be obtained at a low cost.

In particular, when the surface of the p-type contact layer is set to a RMS surface roughness of 3 nm or less, by improving the adhesiveness of the positive electrode, the ohmic characteristics between the p-type contact layer and the positive electrode can be improved, and the contact resistance can be reduced.

In addition, in the manufacturing method of the semiconductor light emitting element of the present invention, the voids can be reliably introduced into the conductive oxide film, and the aforementioned effects can be achieved by means of a simple production method.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION

The semiconductor light emitting element of the present invention is, as described above, formed by electrically connecting a conductive oxide film onto a semiconductor layer.

The conductive oxide film formed on the semiconductor layer is a film containing at least one element selected from the group consisting of zinc (Zn), indium (In), tin (Sn) and magnesium (Mg). Particular examples thereof include ZnO, $In_2O_3$, $SnO_2$, and ITO (a complex oxide of In and Sn). From amongst these, an ITO film is preferred.

Note that in addition to the element (element C) other than oxygen that forms the conductive oxide film, a trace amount of an element (element D) that is different than the constituent element (element C) may also be added. Here, the trace element D can be selected from, for example, tin, zinc, gallium, and aluminum, and may be one of these or two or more of these. The trace element D is preferably contained in an amount at 20% or less of the constituent element (element C) other than oxygen of the conductive oxide film. In addition, the trace element D preferably has a different concentration on the semiconductor layer side and the surface side, and it is more preferable that the concentration thereof on the semiconductor layer side is higher than compared to the surface side. Furthermore, it is preferred that the concentration of trace element D in the conductive oxide film steadily decreases from the semiconductor layer side to the surface. In this way, the ohmic characteristics of the conductive oxide layer with the semiconductor layer can be improved even more, and the crystallinity thereof will be superior. In addition, the term "constituent element" basically means an element that forms an oxide, more particularly an element other than oxygen, and when a trace element is included in the conductive oxide film, the constituent element and the trace element make up about 80% to less than 100% of the conductive oxide film.

Figure 2:
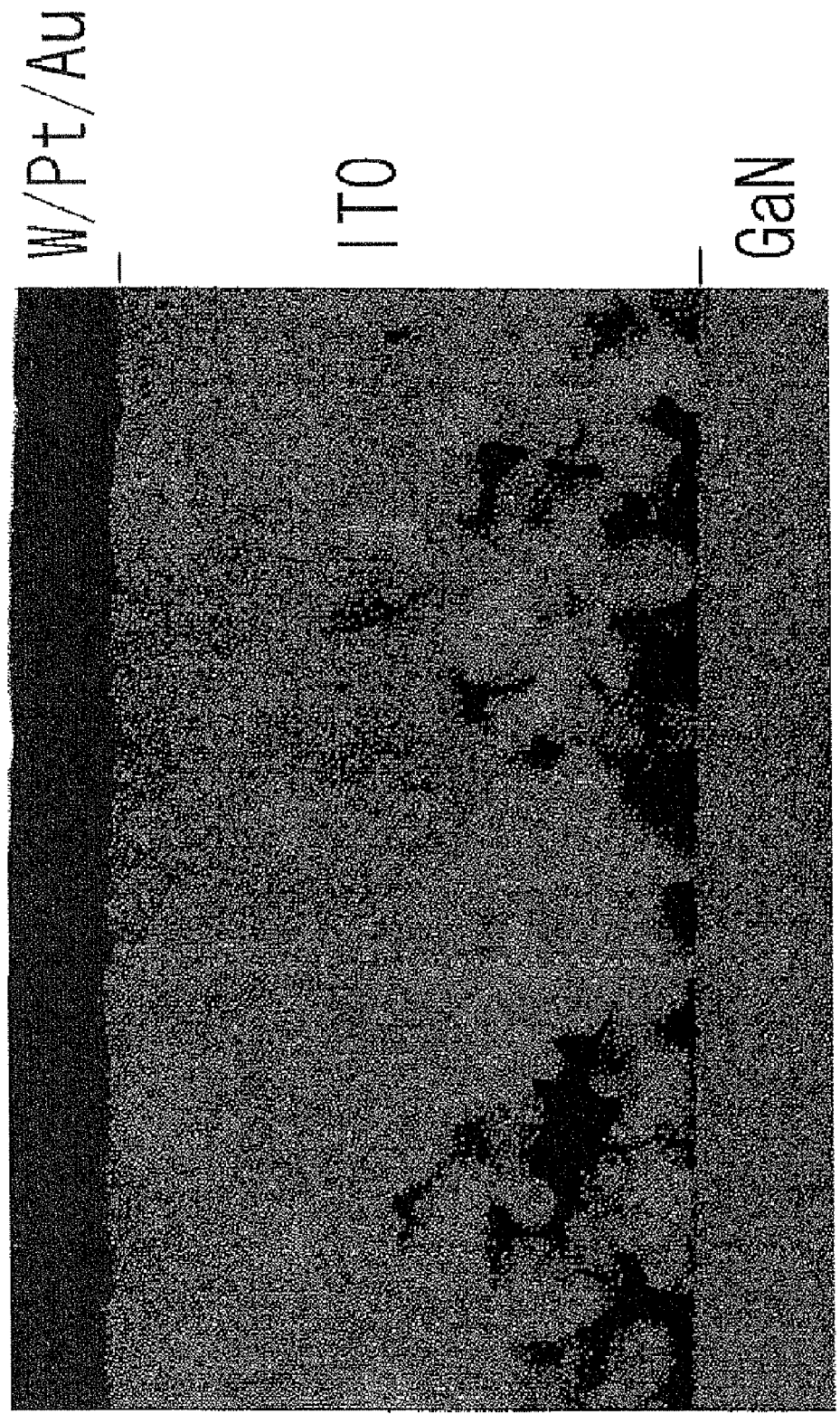
FIG. 2 is a cross-section of a conductive oxide film on the semiconductor light emitting element according to Example 1 of the present invention.

This conductive oxide film, for example as shown in FIG. 2, has a plurality of voids in the vicinity of the interface with the semiconductor layer. In other words, only the vicinity of the interface with the semiconductor layer is in a porous state, and the density thereof is lower compared to the surface side of the conductive oxide film. The voids are, for example, about 20 to 200 nm in diameter. In addition, the density thereof is about 30% to 90% of the surface side of the conductive oxide film. The state of the conductive oxide film described above can, for example, be measured by observing a cross-section thereof by transmission electron microscopy (TEM) or scanning electron microscopy (SEM), measuring the electron diffraction pattern thereof, observation with a superthin film evaluation device, and the like.

Figure 3:
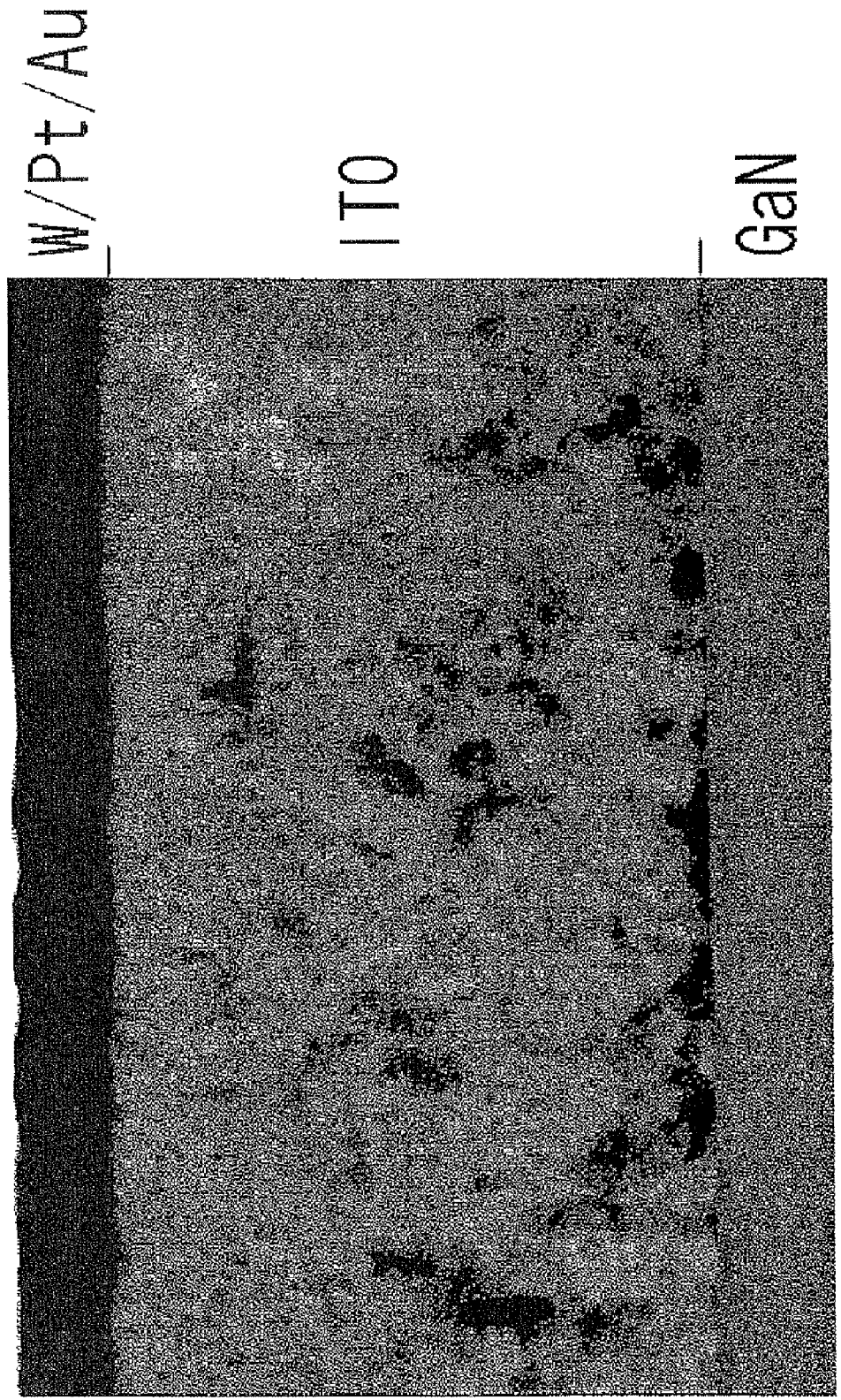
FIG. 3 is a cross-section of a conductive oxide film showing a comparative example with respect to Example 1.

Note that the surface side of the conductive oxide film has excellent crystallinity, and is formed as a transparent film. In particular, the surface side is preferably a flat film, and in contrast to a conductive oxide film having voids throughout as shown in FIG. 3, a conductive oxide film in which the surface side thereof is flat as shown in FIG. 2 has good conductivity and superior light transmittance. In addition, the region of the conductive oxide film having voids on the semiconductor side may include localized amorphous regions, but is preferably formed as a transparent film or almost transparent film not in an amorphous state.

It is desirable for the region having voids in the vicinity of the interface with the semiconductor layer to make up 10 to 50% of the entire thickness of the conductive oxide film from the interface with the semiconductor layer. Thus, by placing the voids only on the semiconductor layer side, the ohmic characteristics with the semiconductor layer can be maintained, and transmissivity can be made excellent. Note that the overall thickness of the conductive oxide film is not particularly limited, but in consideration of the creation of suitable voids near the semiconductor layer side interface, a comparatively low resistance, the light absorbance loss in the conductive oxide layer, and the light extraction ratio, the thickness may for example be about 100 to 1000 nm. In addition, the thickness of the region having the voids may be about 10 to 500 nm. In particular, when heat treatment is to be performed, voids tend not to be obtained in the vicinity of the semiconductor layer side interface if the thickness of the conductive oxide film is less than 100 nm. In addition, the conductive oxide film functions sufficiently as a low resistance film if about 1000 nm, and if larger than 1000 nm, the light absorbance loss will be large, and the light extraction ratio will decline.

In addition, it is preferable that the conductive oxide film not only not absorb visible light, but, for example, also light generated from an active layer due to the gallium nitride type compound semiconductor described above, i.e., light having a wavelength in the vicinity of 360 nm to 650 nm, preferably 380 nm to 560 nm and 400 nm to 600 nm. It is also preferable that the conductive oxide film have good efficiency, e.g., can transmit with a transmissivity of 90% or greater, 85% or greater, or 80% or greater. In this way, the conductive oxide film can be used as an electrode of a semiconductor light emitting element having a desired wavelength. Furthermore, the conductive oxide film preferably has a specific resistance of $1\times10^{-4}$ Ωcm or less, and more preferably about $1\times10^{-4}$ to $1\times10^{-6}$ Ωcm. In this way, the conductive oxide film can be effectively used as an electrode.

The conductive oxide film can be formed by means of well known methods in this field. For example, a variety of methods can be used, such as sputtering, reactive sputtering, vacuum evaporation, ion beam assist evaporation, ion plating, laser ablation, CVD, spraying, spin coating, dipping, or a combination of these methods and heat treatment.

More particularly, when the conductive oxide film, e.g., an ITO film, is to be formed by sputtering, methods that can be employed include a method in which the sputter gas is switched from one having a small or zero oxygen partial pressure to one having a large oxygen partial pressure, or in which the oxygen partial pressure is gradually increased, a method in which a target having a large amount of In or a target having a small amount of oxygen is employed in addition to a target used for ITO film formation, and the target having a large amount of In or the target having a small amount of oxygen is switched during film formation, or a method which gradually or rapidly increases the input power of the sputter device during film formation. In addition, when the conductive oxide film, e.g., an ITO film, is to be formed by vacuum evaporation, methods that can be employed include a method in which the temperature of the semiconductor layer is rapidly or gradually increased or reduced, a method in which the film formation rate is rapidly reduced, or a method in which an ion gun is employed to emit oxygen ions during film formation.

Furthermore, when the conductive oxide film, e.g., an ITO film, is to be formed by ion plating, a method may be employed in which, during film formation, oxygen gas is turned into a plasma and this oxygen plasma is taken into the ITO film. When an ITO film is to be formed by dissolving, dispersing or suspending microparticles of ITO in a solvent and employing a spray method, spin coat method, or dip coat method, a plurality of solvents and the like can be employed in which the amount of In or oxygen contained in the solvent containing ITO is varied, or the atmosphere, temperature, or the like is controlled during drying or sintering. When an ITO film is to be formed by CVD, a method can be employed in which the flow rate of the oxygen gas or a gas containing elemental oxygen is controlled.

In addition, after the conductive oxide film, e.g., an ITO film, is formed, an annealing process may be performed in an atmosphere of a reducing gas (more specifically, carbon monoxide, hydrogen, argon, or the like, or a mixture of two or more of these gases), at a temperature of about 200 to 650° C., and for a period of time determined in accordance with the thickness of the conductive oxide film. Moreover, after forming a conductive oxide film having voids from the semiconductor layer side to the surface, a conductive oxide layer on the conductive oxide layer obtained in prior step, which has no voids or fewer voids than that of prior step may be formed/laminated. In addition, heat treatment may be performed after the conductive oxide film, e.g., an ITO film, is partially formed, and then the film formation may be completed, i.e., in a number of steps such as during film formation. Examples of heat treatment methods include lamp annealing, annealing by heat furnace, and the like. In addition, electron beam irradiation or laser ablation may be used after ITO film formation. Furthermore, these methods may be optionally combined.

Due to this type of heat treatment, voids can be reliably formed in the semiconductor side of the conductive oxide film, and the surface side thereof can be made flat, even when a conductive oxide film is formed in which there are voids that extend across the entire thickness of the conductive oxide film, or in which there are no voids at all, or when the extent to which voids are present on the semiconductor layer side or not present on the surface side is insufficient, or when the surface side is insufficiently flat.

In addition, with a conductive oxide film having the trace element D, voids will in particular tend to be formed by means of an anneal treatment, and the semiconductor layer side having the voids will tend to have more of the trace element D than the surface side which does not have any voids. This is useful because the trace element D is thought to move by means of the anneal treatment, and when there is a large amount of the trace element D on the semiconductor layer side having the voids, the ohmic characteristics will be excellent, and Vf will also decline.

Note that in the semiconductor light emitting element, the conductive oxide film described above is preferably formed as an electrode that covers approximately the entire surface of at least the p-type semiconductor layer. Normally, it is difficult for a conductive oxide film to attain ohmic characteristics with respect to a p-type semiconductor. However, by adopting a conductive oxide film as described above, excellent ohmic characteristics can be achieved. In addition, the conductive oxide film may be formed on the n-type semiconductor layer, and may further be formed on both the p-type semiconductor layer and the n-type semiconductor layer.

The type and form of the metal film to be formed on the conductive oxide film is not particularly limited, and any type and form of metal film can be used if it is normally employed as an electrode. For example, a single layer film or a laminate film of metals such as zinc (Zn), nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag), yttrium (Y), and the like, or alloys thereof, may be used. From among these, those with low resistance are preferred, and more specifically, a single layer film or a laminate film or an alloy of W, Rh, Ag, Pt, Pd, Al, Ti or the like. Furthermore, metal films having excellent adhesiveness with the conductive oxide film, and particularly an ITO film, are preferred, more specifically a single layer film or laminate film of W, Rh, and Pt. In addition, the metal film is preferably one which can function as a pad electrode that is adhered by soldering or is wire bonded.

Note that when the conductive oxide film is formed on both the p-type semiconductor layer and the n-type semiconductor layer as described below, the metal films formed thereon may be of a different type, have a different lamination structure, have a different thickness, or the like, or may be the same. If the same metal film is formed on both, the manufacturing process can be shortened, and a highly reliable and inexpensive semiconductor light emitting element can be obtained.

Examples of the metal film include an Rh/Pt/Au electrode (having respective thicknesses of, for example, 100 nm/200 nm/500 nm) that is sequentially laminated by respectively sputtering Rh, Pt, and Au from the semiconductor layer side, a Pt/Au electrode (having respective thicknesses of, for example, 200 nm/700 nm) that is sequentially laminated by respectively sputtering Pt and Au from the semiconductor layer side, and the like. By making the uppermost layer of the metal film Au, an excellent connection with a conductive wire made primarily of Au can be maintained. In addition, by laminating Pt between Rh and Au, the diffusion of Au or Rh can be prevented, and a highly reliably electrical connection can be obtained as an electrode. In addition, Rh can be ideally employed because it has superior light reflectance characteristics and barrier characteristics, and will improve light emission efficiency. Amongst these, a laminated film of Pt/Au (when face up) or Rh/Au (when face down) are preferred.

The semiconductor layers in the semiconductor light emitting element of the present invention are not particularly limited, and examples thereof include elemental substrates such as silicon, germanium, and the like, and compound semiconductors such as Groups III-V, Groups II-VI, Groups VI-VI, and the like. In particular, nitride semiconductors, and more particularly gallium nitride type compound semiconductors such as $In_xAl_yGa_{1-x-y}N$ (0=x, 0=y, x+y=1) and the like, are ideally employed. The semiconductor layers may be a single layer structure, but may also be a homo structure, a hetero structure, or a double hetero structure having MIS connectors, PIN connectors, or PN connectors, or may be a superlattice structure, a single quantum well structure, or a multi quantum well structure on which a thin film that causes a quantum effect is laminated. In addition, the n-type and/or p-type may be doped with impurities. This semiconductor layer can be formed by means of well-known technology, such as for example the metal organic chemical vapor deposition (MOCV) method, the hydride vapor phase epitaxy (HVPE) method, the molecular beam epitaxy (MBE) method, and the like. The thicknesses of the semiconductor layers are not particularly limited, and various thicknesses may be employed.

Normally, semiconductor light emitting elements well known in this field, such as LEDs, laser diodes, and the like, are formed by means of these types of semiconductor layers. More specifically, a first conductive type semiconductor layer, a light emitting layer, and a second conductive type semiconductor layer are laminated in this order, and an electrode is respectively connected to the first conductive type and second conductive type semiconductor layers. Note that first conductive type means n-type or p-type, and second conductive type means p-type or n-type.

An insulating substrate such as sapphire or the like, or a conductive substrate such as a nitride semiconductor, can be employed as a substrate that forms this type of semiconductor light emitting element. From amongst these, an insulating substrate is preferred. Note that when the insulating substrate is not finally removed, the p-electrode and the n-electrode will be formed on the same planar side of either of the semiconductor layers, and may be either a face up mounting (i.e., the semiconductor layer side is the primary light extraction surface), or a flip chip mounting (face down mounting: a mounting method in which the semiconductor element is electrically and mechanically connected with a support substrate such as a submount material, the electrode formation surfaces of the semiconductor light emitting element on which both the positive and negative electrodes are arranged on the same planar side are made to face the conduction pattern of the support substrate, and are connected via a conductive material, i.e., the substrate side is the primary light extraction surface). In this situation, metallization layers (bumps: Ag, Au, Sn, In, Bi, Cu, Zn, and the like) that serve to connect with external electrodes and the like are respectively formed on top of the p-electrode and the n-electrode, these metallization layers are respectively connected to a pair of positive and negative external electrodes that are provided on the submount, and wires and the like are arranged with respect to the submount. In addition, the substrate may be finally removed, and either face up mounting or flip chip mounting may be employed. Note that the substrate is not limited to sapphire, and for example a well known substrate such as spinel, SiC, GaN, GaAs, or the like may be employed. In addition, the p-electrode and the n-electrode may be arranged on different sides of the substrate from each other by employing a conductive substrate such as SiC, GaN, GaAs, or the like as the substrate.

Examples of the semiconductor layers that form the semiconductor light emitting element of the present invention include the laminated structures described in (1) to (5) below.

(1) A buffer layer composed of GaN of a thickness of 200 Å, an n-type contact layer composed of an Si doped n-type GaN of a thickness of 4 μm, a light emitting layer having a single quantum well structure and composed of undoped $In_{0.2}Ga_{0.8}N$ of a thickness of 30 Å, a p-type clad layer composed of an Mg doped p-type $Al_{0.1}Ga_{0.9}N$ of a thickness of 0.2 μm, and a p-type contact layer composed of an Mg doped p-type GaN of a thickness of 0.5 μm.

(2) A buffer layer composed of AlGaN of a thickness of about 100 Å, an undoped GaN layer of a thickness of 1 μm, an n-side contact layer composed of GaN containing $4.5 \times 10^{18}/cm^3$ of Si of a thickness of 5 μm, an n-side first multi-layer film layer composed of three layers—a bottom layer composed of an undoped GaN of 3000 Å, an intermediate layer composed of GaN containing $4.5 \times 10^{18}/cm^3$ of Si of a thickness of 300 Å, and an upper layer composed of undoped GaN of a thickness of 50 Å (an overall thickness of 3350 Å), an n-side second multi-layer film layer having a superlattice structure in which 10 layers each of a 40 Å nitride semiconductor layer composed of undoped GaN and a 20 Å nitride semiconductor layer composed of undoped $In_{0.1}Ga_{0.9}N$ are repeatedly alternately laminated and a 40 Å nitride semiconductor layer composed of undoped GaN is formed thereon (an overall thickness of 640 Å), a light emitting layer having a multiquantum well structure in which six layers each of a 250 Å barrier layer composed of undoped GaN and a 30 Å well layer composed of $In_{0.3}Ga_{0.7}N$ are repeatedly alternately laminated and a 250 Å barrier composed of undoped GaN is formed thereon (an overall thickness of 1930 Å), an p-side multi-layer film layer having a superlattice structure in which 5 layers each of a 40 Å nitride semiconductor layer composed of $Al_{0.15}Ga_{0.85}N$ containing $5 \times 10^{19}/cm^3$ of Mg and a 25 Å nitride semiconductor layer composed of $In_{0.03}Ga_{0.97}N$ containing $5 \times 10^{19}/cm^3$ of Mg are repeatedly alternately laminated and a 40 Å nitride semiconductor layer composed of $Al_{0.15}Ga_{0.85}N$ containing $5 \times 10^{19}/cm^3$ of Mg is formed thereon (an overall thickness of 365 Å), and a p-side contact layer composed of GaN containing $1 \times 10^{20}/cm^3$ of Mg of 1200 Å thickness.

(3) A buffer layer composed of AlGaN of a thickness of about 100 Å, an undoped GaN layer of a thickness of 1 μm, an n-side contact layer composed of GaN containing $4.5 \times 10^{18}/cm^3$ of Si of a thickness of 5 μm, an n-side first multi-layer film layer composed of three layers—a bottom layer composed of an undoped GaN of 3000 Å, an intermediate layer composed of GaN containing $4.5 \times 10^{18}/cm^3$ of Si of a thickness of 300 Å, and an upper layer composed of undoped GaN of a thickness of 50 Å (an overall thickness of 3350 Å), an n-side second multi-layer film layer having a superlattice structure in which 10 layers each of a 40 Å nitride semiconductor layer composed of undoped GaN and a 20 Å nitride semiconductor layer composed of undoped $In_{0.1}Ga_{0.9}N$ are repeatedly alternately laminated and a 40 Å nitride semiconductor layer composed of undoped GaN is formed thereon (an overall thickness of 640 Å), an active layer having a multiquantum well structure in which a barrier layer composed of undoped GaN of 250 Å thickness is first formed and then 6 layers each of a well layer composed of $In_{0.3}Ga_{0.7}N$ of 30 Å thickness, a first barrier layer composed of $In_{0.02}Ga_{0.98}N$ of 100 Å thickness and a second barrier layer composed of undoped GaN of 150 Å thickness are repeatedly alternately laminated (an overall thickness of 1930 Å) (3-6 layers are preferably repeatedly alternately laminated), an p-side multi-layer film layer having a superlattice structure in which 5 layers each of a 40 Å nitride semiconductor layer composed of $Al_{0.15}Ga_{0.85}N$ containing $5 \times 10^{19}/cm^3$ of Mg and a 25 Å nitride semiconductor layer composed of $In_{0.03}Ga_{0.97}N$ containing $5 \times 10^{19}/cm^3$ of Mg are repeatedly alternately laminated and a 40 Å nitride semiconductor layer composed of $Al_{0.15}Ga_{0.85}N$ containing $5 \times 10^{19}/cm^3$ of Mg is formed thereon (an overall thickness of 365 Å), and a p-side contact layer composed of GaN containing $1 \times 10^{20}/cm^3$ of Mg of 1200 Å thickness.

Furthermore, by making a bottom layer composed of undoped GaN of 3000 Å arranged on the n-side the bottom layer of a three layer structure composed of a first layer composed of undoped GaN of 1500 Å thickness, a second layer composed of GaN containing $5 \times 10^{17}/cm^3$ of Si of 100 Å thickness, and a third layer composed of undoped GaN of 1500 Å thickness, it will become possible to control Vf fluctuation that accompanies the elapsed drive time of a light emitting element.

(4) A buffer layer, an undoped GaN layer, an n-side contact layer composed of GaN containing $6.0 \times 10^{18}/cm^3$ of Si, an undoped GaN layer (an n-type nitride semiconductor layer of an overall thickness of 6 nm), an active layer having a multiquantum well structure in which 5 layers each of a GaN barrier layer containing $2.0 \times 10^{18}/cm^3$ of Si and a InGaN well layer are repeatedly alternately laminated (overall thickness: 1000 Å), and a p-type nitride semiconductor layer composed of GaN containing $5.0 \times 10^{18}/cm^3$ of Mg of a thickness of 1300 Å, and may also include a InGaN layer between a translucent conductive layer and a p-type nitride semiconductor layer that is 50 Å in thickness. Thus, when a 30 to 100 Å thickness, preferably a 50 Å thickness, InGaN layer is provided, this layer can be placed in contact with a positive electrode, and will become a p-side contact layer.

(5) A buffer layer, an undoped GaN layer, an n-side contact layer composed of GaN containing $1 \times 10^{19}/cm^3$ of Si, an undoped GaN layer (an n-type nitride semiconductor layer of an overall thickness of 6 nm), an active layer having a multiquantum well structure in which 7 layers each of a GaN barrier layer containing $3.0 \times 10^{18}/cm^3$ of Si and an InGaN well layer are repeatedly alternately laminated (overall width: 800 Å), and a p-type nitride semiconductor layer composed of GaN containing $2.5 \times 10^{20}/cm^3$ of Mg of a thickness of 1300 Å, and may also include a InGaN layer between a translucent (i.e., transparent) conductive layer and a p-type nitride semiconductor layer that is 50 Å in thickness. Thus, when a 30 to 100 Å thickness, preferably a 50 Å thickness InGaN layer is provided, this layer can be placed in contact with a positive electrode, and will become a p-side contact layer.

In particular, the nitride semiconductor layer that is in contact with the conductive oxide film is employed as a p-side contact layer in order to make the contact between the nitride semiconductor layer and the positive electrode that is electrically connected thereto excellent. For example, the p-side contact layer is preferably a p-type contact layer, and more preferably a p-type nitride semiconductor layer. However, the p-side contact layer may function as a clad layer or an other layer. P-type impurities are preferably doped in the p-side contact layer. The dopant is not particularly limited, and it is suitable to employ elements that demonstrate p-type conductivity due to the material of the p-side contact layer For example, when the p-side contact layer is a nitride semiconductor, i.e., GaN, AlN, InN, or mixed crystals of these (e.g., $In_xAl_yGa_{1-x-y}N$, $0=x$, $0=y$, $x+y=1$) or the like, examples of the p-type impurities include, for example, Mg, Zn, Cd, Be, Ca, Ba, and the like, and from amongst these, Mg is preferred. The doping density is, for example, about $1.5 \times 10^{20}$ cm$^{-3}$ or greater, and preferably about $1.5 \times 10^{20}$ to $1 \times 10^{22}$ cm$^{-3}$. The doping of impurities may be performed at the same time as film formation, and may be performed after film formation by vapor diffusion, solid diffusion, ion implantation, and the like.

The thickness of the p-type contact layer is 250 Å or less, and preferably about 50 to 250 Å. In addition, the RMS (root mean square) surface roughness of the surface of the p-type contact layer is set to about 3 nm, and is preferably set to about 2 nm or less. Examples of methods to adjust the surface roughness of the p-contact layer include polishing the surface of the p-type contact layer, etching the surface thereof by means of the RIE method, and the like. Note that the RMS can, for example, be measured with any method.

In addition, the semiconductor light emitting element of the present invention may also include a light conversion material that converts a portion of the light from the light emitting element to light having a different wavelength. In this way, a light emitting device can be obtained in which the light of the light emitting element is converted, and by mixing the emitted light of the light emitting element and the converted light, a light emitting device can be obtained that emits white light, light bulb colored light, or the like. By providing a semiconductor light emitting element or a light emitting device comprised of a conductive oxide film and a light conversion material, even if the amount of the light conversion material is lower than that used conventionally, the desired light emissions, such as white light or light bulb light, can be obtained because the light will tend to be diffused due to the voids of the conductive oxide film.

Examples of the light conversion member includes an aluminum garnet type phosphor containing Al and at least one element selected from Y, Lu, Sc, La, Gd, Tb, Eu, and Sm, and at least one element selected from Ga and In, and an aluminum garnet type phosphor containing at least one element selected from the rare earth elements. In this way, even if the light emitting element is used at a high output and with high heat generation, a light emitting device can be obtained that has superior temperature characteristics and superior durability.

In addition, the light conversion member may be a phosphor represented by $(Re_{1-x}R_x)_3(Al_{1-y}Ga_y)_5O_{12}$ (0<x 1, 0≦y≦1, however, Re is at least one element selected from the group consisting of Y, Gd, La, Lu, Tb, and Sm, and R is Ce or Ce and Pr). In this way, as noted above, a high output light emitting element having superior temperature characteristics and durability can be obtained, and in particular, when the active layer is InGaN, the temperature characteristics will change in accordance with the blackbody radiation, and thus will be advantageous with white light emission.

Furthermore, the light conversion member may be a nitride phosphor containing N, at least one element selected from Be, Mg, Ca, Sr, Ba and Zn, and at least one element selected from C, Si, Ge, Sn, Ti, Zr and Hf, and is activated by at least one element selected from the rare earth elements. A more specific example is the general formula $L_XSi_YN_{((2/3X+4/3Y)}$:Eu or $L_XSi_YO_ZN_{((2/3X+4/3Y-2/3Z)}$:Eu (L is Sr or Ca, or either of Sr and Ca). In this way, like with the aforementioned phosphor, a high output light emitting element having superior temperature characteristics and durability can be obtained. From amongst these, a silicon nitride oxide compound is preferred. In addition, by combining the aforementioned aluminum garnet phosphors, a light emitting device can be obtained in which both temperature characteristics will be mutually applied and in which the temperature variation of the mixed colors will be small.

With the semiconductor light emitting element of the present invention, it is preferable that the metal film not be employed as a pad electrode alone, and that an auxiliary electrode that projects from the pad electrode be provided. In this way, the entire active layer can be made to emit light with good efficiency, and the semiconductor light emitting element of the present invention will be effective when arranged with a face up mounting. Note that the configuration of the pad electrode will be described below in detail in the examples.

Furthermore, with the semiconductor light emitting device of the present invention, the conductive oxide film and/or the metal film may be formed into various shapes, such as for example a round shape, a polygon shape such as a square or the like, a comb shape, a stripe shape, or the like. In particular, when the conductive oxide film and/or the metal film are formed across the entire surface of the semiconductor layer, a semiconductor light emitting element can be obtained in which the area of the semiconductor layer, and particularly the light emitting layer, is comparatively large, and light emission that is uniform across the entire surface of the light emitting element can be obtained. The shape of the conductive oxide film and/or the metal film will be described in detail in the examples below.

In addition, the semiconductor light emitting element of the present invention, as noted above, can be employed in various packages in which face up mounting, face down mounting, or the like is performed. In other words, by using a conductive oxide film that has good crystallinity and does not have voids on the surface of the side opposite the semiconductor layer, when electrical connections are formed by soldering for wire bonding (face up) or by bumps (face down), the lifespan of the semiconductor light emitting device can be improved because damage to the conductive oxide film and/or the metal film will be reduced and adhesiveness will be excellent. In other words, the lifespan of the semiconductor light emitting device can be improved when the surface of the conductive oxide film that is on the side opposite the semiconductor layer has high adhesiveness, and the semiconductor layer side of the conductive oxide layer has a plurality of voids. As a result, the conductive oxide film of the present invention can be mounted to the semiconductor film with excellent ohmic characteristics, and a light emitting device can be obtained in which a semiconductor light emitting element is mounted which has improved light extraction efficiency due to the excellent transmissivity of the conductive oxide film. The shape of the conductive oxide film and/or the metal film will be described in detail in the examples below.

The semiconductor light emitting element of the present invention will be described in detail below with reference to the figures.

EXAMPLE 1

Figure 1:
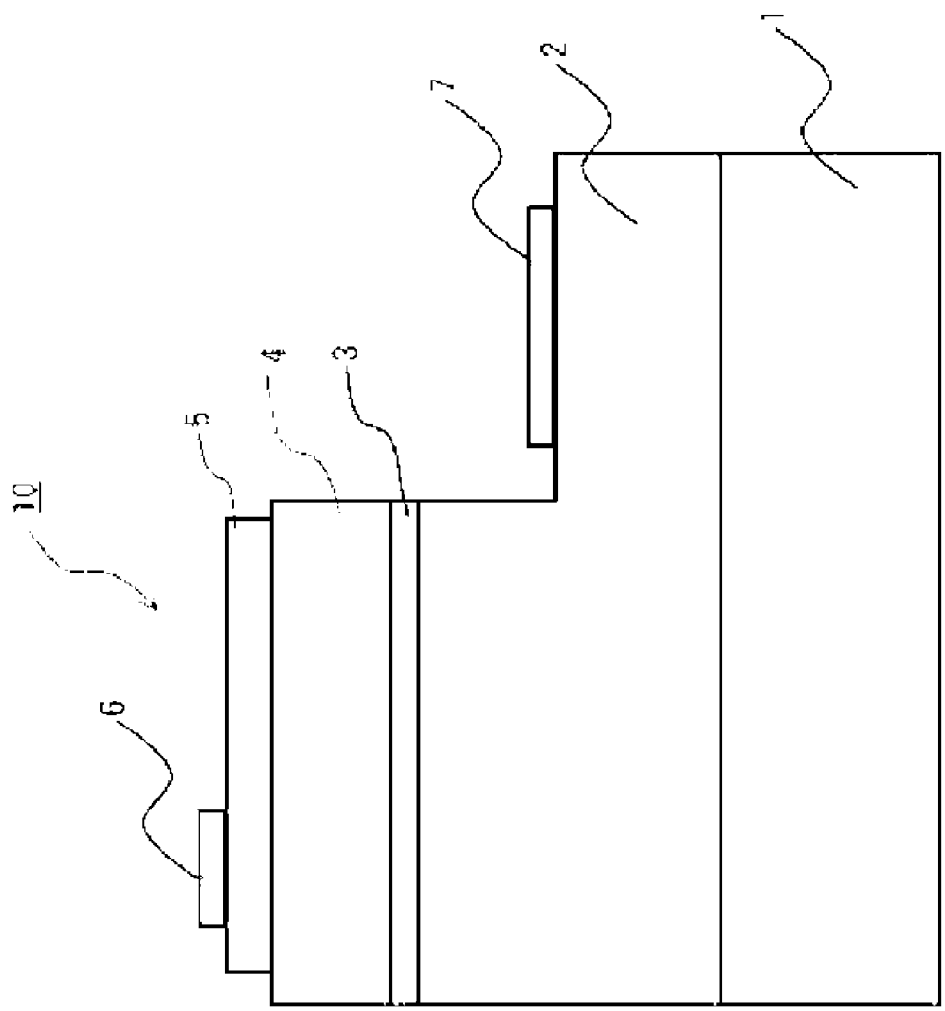
FIG. 1 is cross-sectional view of a semiconductor light emitting element according to Example 1 of the present invention.

A semiconductor light emitting element of this example is shown in FIG. 1.

The semiconductor light emitting element 10 is formed by laminating, in this order, onto a sapphire substrate 1, a buffer layer (not shown in the figures) composed of $Al_{0.1}Ga_{0.9}N$, and an undoped GaN (not shown in the figures). On top of that are laminated an n-type contact layer composed of Si doped GaN as an n-type semiconductor layer 2, and a superlattice n-type clad layer in which a GaN layer (40 Å) and a InGaN layer (20 Å) are alternately laminated 10 times.

On top of that are laminated an active layer 3 having a multiquantum well structure in which a GaN layer (250 Å) and an InGaN layer (30 Å) are alternately laminated 3 to 6 times, a superlattice p-type clad layer as a p-type semiconductor layer 4 in which an $Al_{0.1}Ga_{0.9}N$ layer doped with Mg (40 Å) and an InGaN layer doped with Mg (20 Å) are alternately laminated 10 times, and a p-type contact layer composed of GaN doped with Mg.

The active layer 3 and the p-type semiconductor layer 4 are removed from a portion of the n-type semiconductor layer 2, a portion of the n-type semiconductor layer 2 is removed and exposed in the thickness direction thereof, and an n-electrode 7 is formed on top of the exposed n-type semiconductor layer 2.

A conductive oxide film 5 composed of ITO is formed on substantially the entire surface of the p-type semiconductor layer 4, and a pad electrode 6 is formed on a portion of the conductive oxide film 5. Note that the conductive oxide film 5 has a plurality of voids formed in the film on the semiconductor layer side thereof.

This type of semiconductor light emitting element can be formed by the following production process.

Formation of the Semiconductor Layer

An MOVPE reaction device is employed to deposit, on a 2 inchϕsapphire substrate 1, and in the following order, a buffer layer composed of $Al_{0.1}Ga_{0.9}N$ of 100 Å thickness, an undoped GaN layer of 1.5 μm thickness, an n-type contact layer as a n-type semiconductor layer 2 composed of Si doped GaN of 2.165 μm thickness, a superlattice n-type clad layer 5 of 640 Å thickness in which a GaN layer (40 Å) and a InGaN layer (20 Å) are alternately laminated 10 times, an active layer 3 having a multiquantum well structure in which a GaN layer (250 Å) and an InGaN layer (30 Å) are alternately laminated 3 to 6 times, a superlattice p-type clad layer as a p-type semiconductor layer 4 of 0.2 μm thickness in which an $Al_{0.1}Ga_{0.9}N$ layer doped with Mg (40 Å) and an InGaN layer doped with Mg (20 Å) are alternately laminated 10 times, and a p-type contact layer composed of Mg doped GaN of 0.5 μm thickness, and thereby produce a wafer.

Etching

The wafer obtained is then annealed at 600° C. in a nitrogen atmosphere in a reaction vessel to further reduce the resistance of the p-type clad layer and the p-type contact layer.

After annealing, the wafer is removed from the reaction vessel, a mask of a predetermined shape is formed on the surface of the p-type contact layer, etching is performed from the top of the mask in an etching device, and a portion of the n-type contact layer is thereby exposed.

Formation of the ITO Film

After the mask is removed, the wafer is placed in a sputter device, and an oxide target composed of a sintered compact of $In_2O_3$ and $SnO_2$ is placed inside the sputter device. Sputtering is performed in the sputter device in an oxygen atmosphere, with a mixed gas of argon and oxygen (20:1) as the sputter gas, and for example at an RF power of 10 W/cm$^2$ for 20 minutes. Next, the RF power is changed to 2 W/cm$^2$ and sputtering is performed for 20 minutes to form a conductive oxide film 5 composed of ITO of 5000 Å thickness on substantially the entire surface of the p-type contact layer of the wafer.

The conductive oxide film 5 thus obtained has excellent transmissivity, and the sapphire substrate 1 is visible therethrough.

Formation of the Pad Electrodes

A mask having a predetermined pattern is formed by means of a resist on the conductive oxide film 5, a W layer, Pt layer and an Au layer are laminated in this order thereon, and a pad electrode 6 for bonding is formed at an overall thickness of 1 μm by the lift-off method.

Then, an n-electrode 7 composed of Rh/Pt/Au was formed on the n-type contact layer at a thickness of 7000 Å.

Next, heat treatment was performed at 400 to 600° C. in an annealing device.

By dividing the wafer thus obtained at predetermined position, a semiconductor light emitting element 10 was obtained.

A cross-section of the semiconductor light emitting element formed as described above was examined by means of STEM (JEM-2010F, manufactured by JEOL Ltd.). This cross-section is shown in FIG. 2.

From FIG. 2 it can was confirmed that a plurality of voids of about 20 to 200 nm were formed in the ITO film only in the vicinity of the interface with the semiconductor layer side, and the ITO film had a dense crystalline state on the surface side thereof. In addition, the region in which the voids were formed made up about 50% of the entire thickness of the ITO film. Furthermore, it was confirmed that the ITO film was transparent, and that crystallinity was excellent.

In addition, an Auger electron spectroscope (JAMP-7500F, manufactured by JEOL Ltd.) was employed to measure the Sn concentration in the ITO film, and it was observed that Sn was distributed at a concentration in the vicinity of the interface with the semiconductor layer that was high with respect to the surface side, and the concentration thereof from the semiconductor layer side to the surface side tended to gradually decline. Note that the Sn concentration is a value that is quantitatively obtained by irradiating $Ar^+$ from the surface side of the ITO film at a sputter rate of 30 nm/minute, and an acceleration energy of 3 keV, measuring the depth profile, and then dividing the peak strength by a relative sensitivity factor (a value from a particular device) that is possessed by each element such as indium, tin, and the like.

As a Comparative Example A, during the ITO film formation process, an ITO film was formed by the same method as in Example 1, except that sputtering was performed (4000 Å film thickness) for 20 minutes at room temperature at a constant RF power of 10 W/cm$^2$ during the formation of the ITO film.

This semiconductor light emitting element was examined by means of STEM (JEM-2010F, manufactured by JEOL Ltd.) in the same way. This cross-section is shown in FIG. 3.

From FIG. 3, it was confirmed that the ITO film has small holes throughout the entirety in the thickness direction, crystallinity was poor throughout the entirety in the thickness direction, and transmissivity was reduced.

In addition, as a Comparative Example B, sputtering was performed at film formation temperature of 300° C., and for 20 minutes like with Comparative Example A, and an ITO film of 4000 Å thickness was formed. The obtained film did not have voids, and was dense throughout the film direction.

Note that with regard to the ITO film of FIG. 3 obtained in Comparative Example A, after heat treatment was performed under the same conditions as Example 1, it was confirmed that the ITO film was approximately the same as the ITO film shown in FIG. 2, a plurality of voids of about 20 to 200 nm were only formed in the vicinity of the interface of the semiconductor layer, and a dense film having excellent crystallinity was formed on the surface side.

In addition, with regard to the ITO film obtained in Comparative Example B, changes in the structure were not seen due to the heat processing.

Thus, due to the construction of the conductive oxide film of the present invention, by increasing the density of the electric current between the ITO film and the semiconductor layer, the Schottky barrier can be reduced, and the contact resistance between the ITO film and the semiconductor layer can be lowered. In addition, electric current can uniformly spread inside the ITO film in the in-plane direction, electric current can uniformly spread from the ITO film to the entire semiconductor layer, and the active layer can efficiently generate light.

Moreover, the ITO film will be dense and have excellent crystallinity on the surface side and light diffusion will be prevented, while at the same time transmissivity can be improved and the electrode side can be made into a light emission observation surface.

When the characteristics of the semiconductor light emitting element thus obtained were evaluated, it was confirmed that Vf was 3.5 V at 20 mA. In addition, as the Comparative Example B, a light emitting element on which an ITO film was formed having no voids in the vicinity of the interface of the semiconductor layer side of the ITO film, and having excellent crystallinity and density in the entirety of the ITO film, was found to have a Vf of 3.6 at 20 mA.

In addition, with the ITO film in Comparative Example B, the ohmic characteristics with the semiconductor layer were poor, and Vf was not stable and was a comparatively large value.

EXAMPLE 2

The semiconductor light emitting element of this example has the same construction as that of Example 1, and is produced by substantially the same method as that of Example 1, except that when the ITO film is to be formed in the production method of Example 1, argon is initially employed as the sputter gas, and then is changed to a mixed gas of argon and oxygen.

Note also that when the sputter gas pressure during film formation is about 0.01 to 0.5 Pa, the partial pressure of the oxygen during film formation and thereafter is set to about $1 \times 10^{-4}$ to $1 \times 10^{-2}$ Pa. In addition, film formation is performed for about 20 minutes with argon, and then film formation is performed for about 5 minutes with the mixed gas of argon and oxygen.

With the semiconductor light emitting element thus obtaining, like with that of Example 1, the ohmic characteristics are excellent, transmissivity was good, light extraction efficiency will be increased, and the electrode side thereof will be made into a light emission observation surface.

EXAMPLE 3

The semiconductor light emitting element of this example has substantially the same construction as that of Example 1, except that after the ITO film is formed in the production method of Example 1, or after a 5000 Å ITO film is formed while maintaining a constant RF power at room temperature in the production method of Example 1, lamp annealing is performed at, for example, 500 to 600° C. in a reducing gas atmosphere (e.g., a hydrogen gas atmosphere).

With the semiconductor light emitting element thus obtaining, like with that of Example 1, the ohmic characteristics are excellent, transmissivity is good, light extraction efficiency will be increased, and the electrode side thereof will be made into a light emission observation surface.

EXAMPLE 4

The semiconductor light emitting element of this example has the same construction as that of Example 1, and is produced by substantially the same method as that of Example 1, except that when the ITO film is to be formed in the production method of Example 1, the vacuum evaporation method is used instead of the sputter method.

A wafer in which a portion of the n-type contact layer is exposed is inserted into a vacuum evaporation device, and an ITO film is formed by maintaining the wafer temperature at 100° C. while heating and evaporating ITO that is 10% $SnO_2$ with an electron gun. During film formation, the wafer temperature is rapidly increased in 10 seconds up to 300° C., and an ITO film of 5000 Å thickness is formed.

With the semiconductor light emitting element thus obtaining, like with that of Example 1, the ohmic characteristics are excellent, transmissivity is good, light extraction efficiency will be increased, and the electrode side thereof will be made into a light emission observation surface.

EXAMPLE 5

The semiconductor light emitting element of this example has the same construction as that of Example 4, and is produced by substantially the same method as that of Example 4, except that when the ITO film is to be formed by the vacuum deposition method, and the wafer temperature is maintained at 300° C., an ion gun is used only at the initiation of film formation to implant the wafer surface (the p-type semiconductor layer) with about $10^{12}$ oxygen ions/$cm^2$.

EXAMPLE 6

The semiconductor light emitting element of this example has the same construction as that of Example 4, and is produced by substantially the same method as that of Example 4, except that when the ITO film is to be formed by the vacuum deposition method, the wafer temperature is maintained at room temperature while the film formation rate at the initiation thereof is set to 50 Å/sec, then reduced to 5 Å/sec, and the ITO film is then heated to make it transparent.

EXAMPLE 7

The semiconductor light emitting element of this example has the same construction as that of Example 5, and is produced by substantially the same method as that of Example 5, except that when the ITO film is to be formed by the vacuum deposition method, the wafer temperature is maintained at 300° C. while the film formation rate at the initiation thereof is set to 50 Å/sec, and then reduced to 5 Å/sec.

EXAMPLE 8

Figure 4:
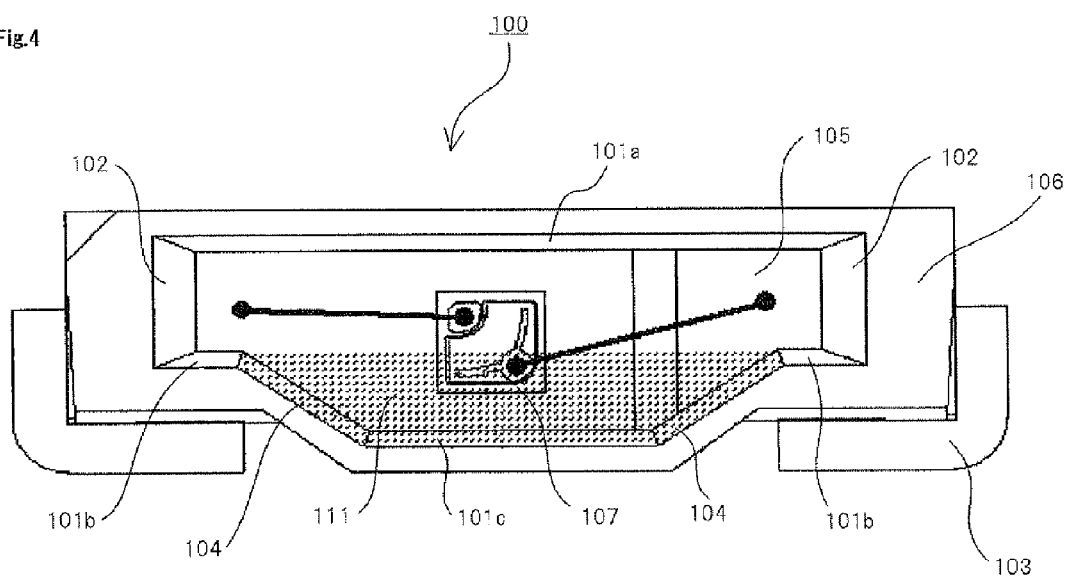
FIG. 4 is a front view of a light emitting device which employs the semiconductor light emitting element of Example 8 of the present invention.

FIG. 4 shows a schematic front view of a surface mount (SMD) type of light emitting device 100 of the present example, viewed from the light emission observation surface (i.e., the main surface direction of a package 106). The surface mount (SMD) type of light emitting device 100 shown in FIG. 4 is a light emitting device comprised of an LED chip 107, and a package 106 comprised of an opening in which the LED chip 107 is accommodated, and in which a portion of the main surface of a lead electrode 105 on which the LED chip 107 is mounted is exposed from the bottom surface of the opening. Furthermore, the opening includes projections 111, and the inner wall surfaces of the opening include an inner wall surface 101a that extends along the long side of the main surface of the package 106, a pair of inner wall surfaces 102 that extend along the short sides thereof and face each other, inner wall surfaces 101b that face the inner wall surface 101a that extends along the long side, an inner wall surface 101c that faces the inner wall surface 101a and on which are arranged the projections 111, and inner wall surfaces 104 that continuously extend from the inner wall surfaces 101b to the inner wall surface 101c and are arranged at a predetermined angle.

The opening of the main surface of the package 106 is arranged approximately perpendicular to the mounting surface of the light emitting device 100 and an exterior support substrate to which a conductive pattern is applied, and light from the light emitting element of the light emitting device will project in a direction approximately parallel to the mounting surface. Furthermore, a portion of the opening of the package 106 includes projections 111 that project in the mounting surface direction, and the inner wall surfaces on which the projections are provided are the pair of facing inner wall surfaces 104 and the inner wall surface 101c. Here, the projections 111 are shown in FIG. 4 as a dotted region in a portion of the opening. The main surface of the lead electrode 105 extends along the bottom surface of the projections 111, and a portion of the LED chip 107 is mounted thereon.

In addition, the surfaces on the mounting surface side of lead electrodes 103 that project from an outer wall surface of the package 106 are curved in the direction of the main surface of the package, so that the outer wall surfaces that face the inner wall surface 101c on which the projections 111 are formed will be approximately parallel with each other. Furthermore, end portions of the lead electrodes 103 are curved along the outer wall surfaces of the package in a direction opposite that of the mounting surface. Thus, by providing the lead electrodes 103, the light emitting device can be made smaller than those of the prior art, and can be stably mounted on an external substrate.

The LED chip of the present example employs a nitride semiconductor element as a light emitting layer, and includes an $In_{0.2}Ga_{0.8}N$ semiconductor whose monochromatic light emission peak is 475 nm and thus visible light. More specifically, the LED chip can be formed by flowing TMG (trimethyl gallium) gas, TMI (trimethyl indium) gas, nitrogen gas, and dopant gas together with a carrier gas onto a clean sapphire substrate, and forming a nitride semiconductor with the MOCVD method. By switching between $SiH_4$ and $Cp_2Mg$ as the dopant gas, an n-type nitride semiconductor layer and a p-type nitride semiconductor layer will be formed.

The element structure of the LED chip has an n-type GaN layer (an undoped nitride semiconductor), a GaN layer which forms an Si doped n-type electrode and that will become an n-type contact layer, and an n-type GaN layer (an undoped nitride semiconductor) laminated on a sapphire substrate, and then one set composed of a GaN layer (a barrier layer) that forms a light emitting layer, an InGaN layer that forms a well layer, and a GaN layer (a barrier layer), will be laminated 5 times thereon as a multiple quantum well structure. An AlGaN layer doped with Mg as a p-type clad layer, and a GaN layer doped with Mg that is a p-type contact layer, are sequentially laminated on the light emitting layer (note that the GaN layer is formed at a low temperature on the sapphire substrate as a buffer layer, and the p-type semiconductor is annealed after formation at 400° C.).

By etching the same planar sides of the nitride semiconductors on the sapphire substrate, the surfaces of the p-type and n-type contact layers will be exposed.

In one area of the central region, the n-type contact layer is exposed by etching and removing a portion of the p-type semiconductor layer 52 and the active layer. Then, a cut-out 51a is provided that exposes the n-type contact layer 51, and sputtering is employed to form a negative pad electrode containing W/Pt/Au in the cut-out 51a as an n-electrode 53.

After a transparent electrode of ITO is formed on the entire surface of the p-type contact layer, a pad electrode will be formed on a portion of the transparent electrode. This ITO film is formed by the same method as in Example 1, a plurality of voids are formed therein in only the vicinity of the interface with the semiconductor layer side, and the surface side of the ITO film is dense and has excellent crystallinity.

A p-side pad electrode 55 is formed on a region that is furthest from the n-electrode. In addition, two auxiliary electrodes 56 are connected to the p-side pad electrode 55, and the auxiliary electrodes 56 extend along an area adjacent to the p-side pad electrode 55 on both sides of the p-side pad electrode 55. In this way, an active layer positioned between the p-side pad electrode 55 and the n-electrode 53 can emit light with good efficiency. Furthermore, by forming the auxiliary electrodes 56 connected to the p-side pad electrode 55 so that they electrically conduct on the transparent electrode 54, electric current can be effectively diffused in the entire p-layer, and the entire light emitting layer can emit light with good efficiency. Moreover, emitted light having high luminance will be obtained in the area around the p-side pad electrode 55 and the auxiliary electrodes 56. Thus, in the present invention, it is more preferable to effectively use the emitted light having high luminance that is in the area around the auxiliary electrodes 56.

Figure 5:
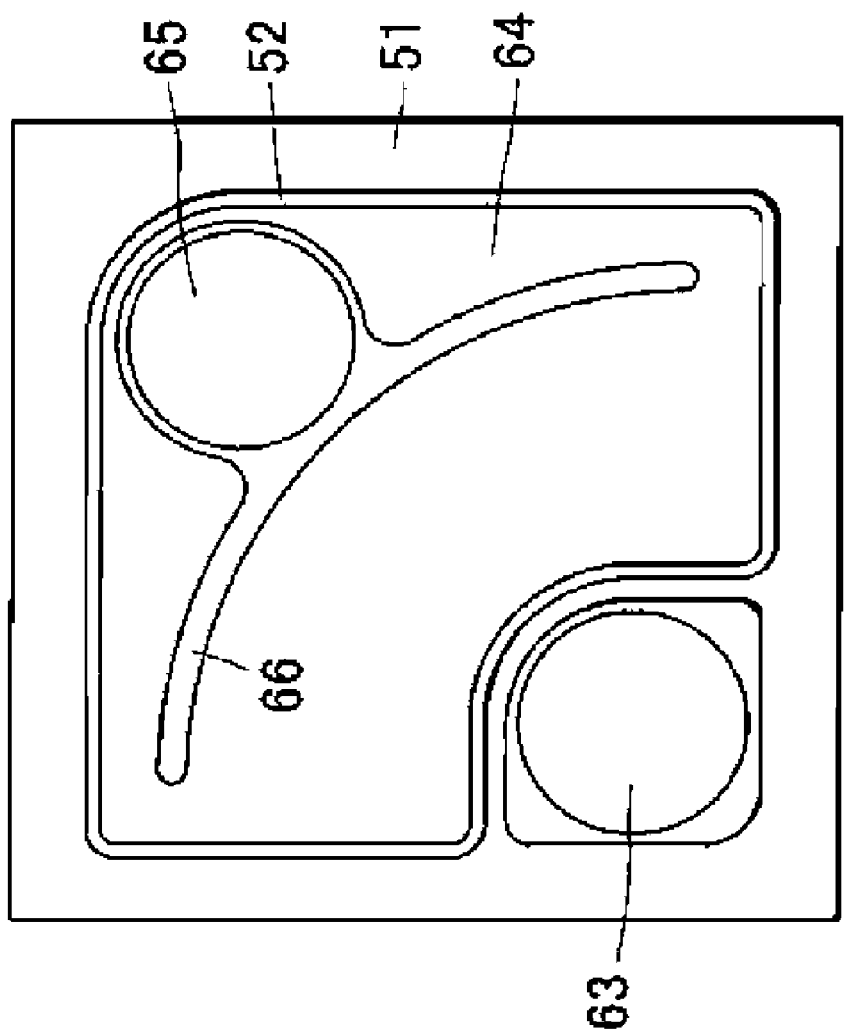
FIG. 5 is a plan view which describes the shape of electrodes of the semiconductor light emitting element of Example 8 of the present invention.
Figure 6:
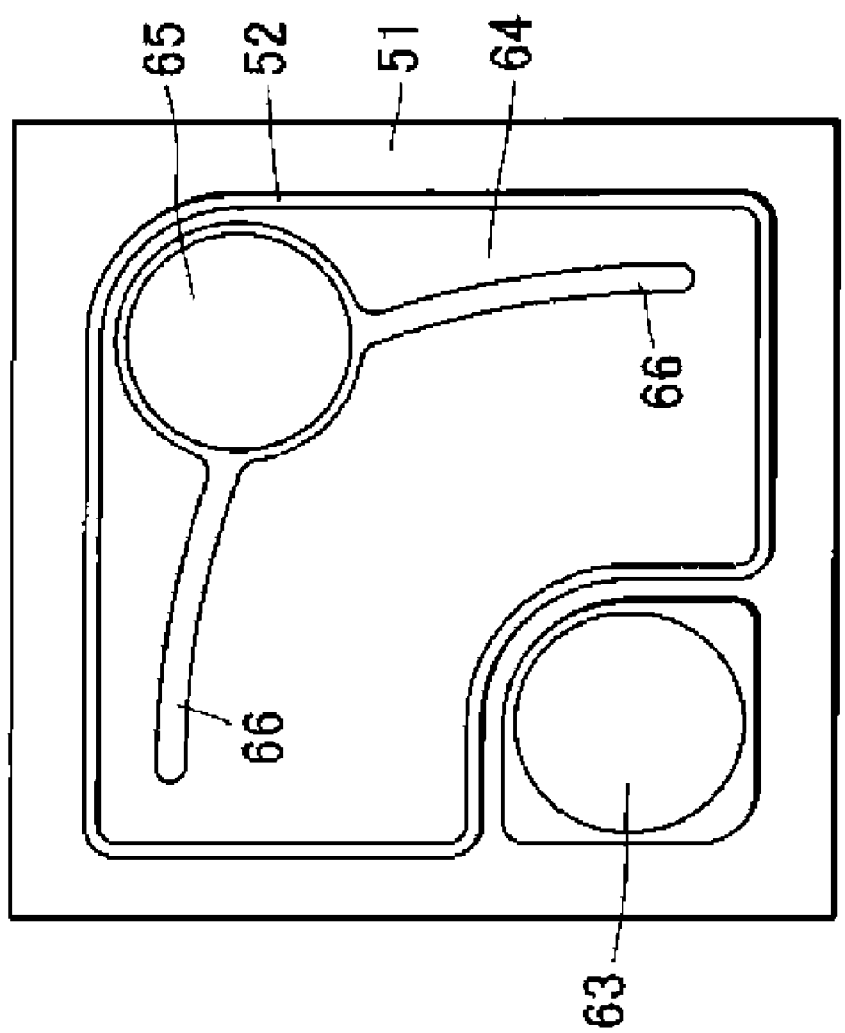
FIG. 6 is a plan view which describes the shape of electrodes of the semiconductor light emitting element of Example 8 of the present invention.
Figure 7:
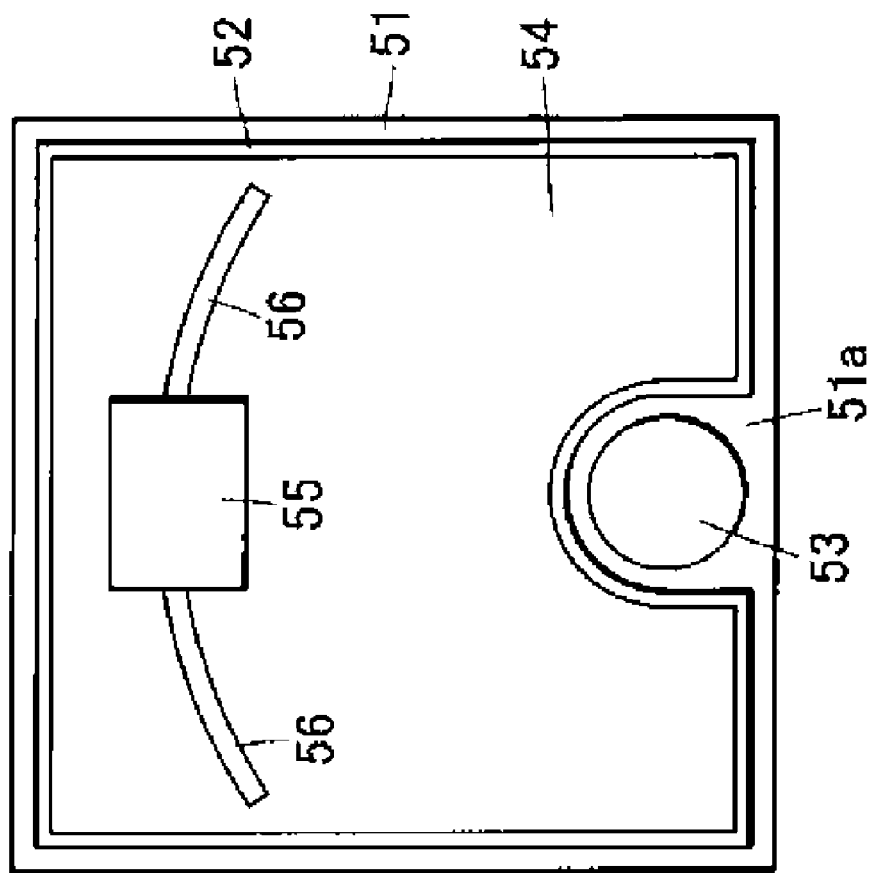
FIG. 7 is a plan view which describes the shape of electrodes the semiconductor light emitting element according to Example 8 of the present invention.
Figure 8:
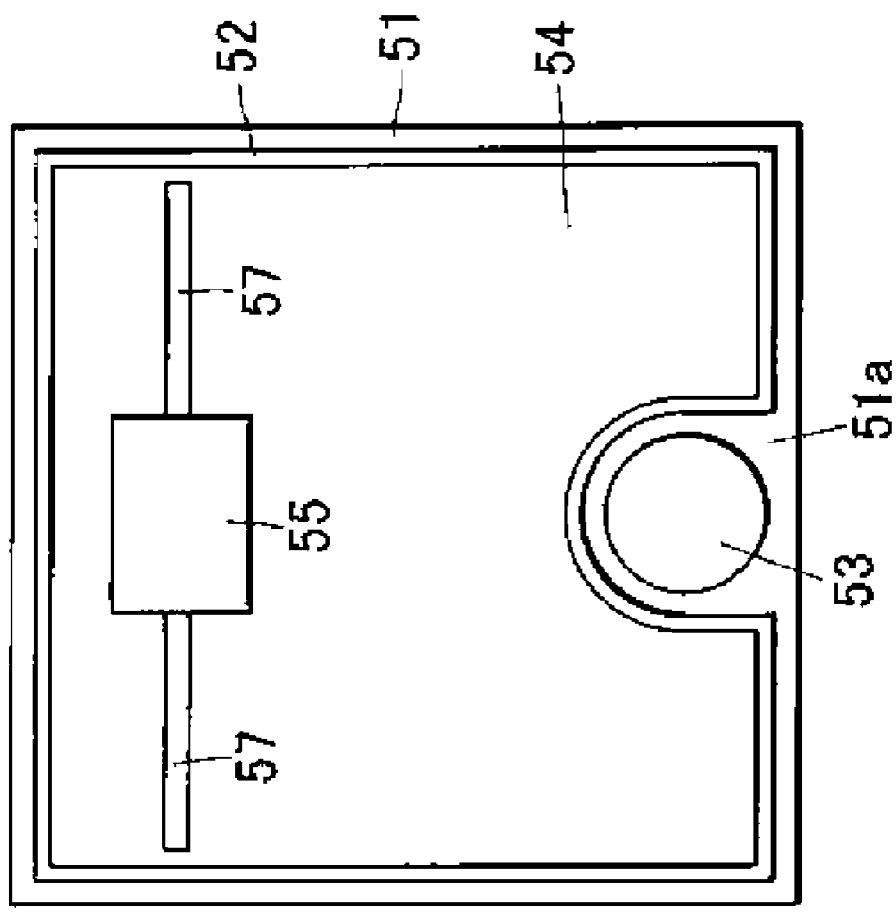
FIG. 8 is a plan view which describes the shape of electrodes of the semiconductor light emitting element according to Example 8 of the present invention.

For example, as shown in FIGS. 5 and 6, when an n-electrode 63 is arranged so as to be near two edges in a corner of the LED chip, and a p-side pad electrode is arranged in another corner opposite the corner adjacent to the n-electrode 63, each auxiliary electrode 66 is preferably formed in an arc shape, and thus emitted light that is highly luminous and more uniform can be obtained. In addition, as shown in FIG. 7, when the n-electrode 53 is formed so as to be near at least one edge of the LED chip, the auxiliary electrodes 56 are preferably formed in an arc shape so as to be equidistant from the n-electrode 53. Thus, as shown in FIG. 8, a more uniform emitted light distribution can be obtained than compared to when the auxiliary electrodes 56 are arranged in straight lines.

Note that it is preferable that the gap shown in FIGS. 5 to 8 between the auxiliary electrodes 56, 66 and the edge of the light emitting layer be clear, so as to maintain a peripheral portion between the auxiliary electrodes 56, 66 and the edge of the light emitting layer and the p-layer formed along the auxiliary electrodes 56, 66 in which the aforementioned highly luminous emitted light can be obtained. When the sheet resistance Rn ohm/square of the n-type contact layer and the sheet resistance Rp ohm/square of the transparent p-electrode satisfy the relationship "Rp equal to Rn" or "Rp larger than Rn", the gap between the auxiliary electrodes 56, 66 and the edge of the light emitting layer is, in consideration of the view point that the peripheral region in which highly luminous emitted light is obtained can be sufficiently maintained (the region in which highly luminous emitted light is to be obtained will not extend beyond the outer sides thereof), and portions will not be formed along the adjacent area in which the emitted light has low luminosity, and thus will cause an overall improvement in luminosity, preferably between 20 µm and 50 µm.

These auxiliary electrodes cause electric current input into the semiconductor light emitting element to diffuse throughout the transparent electrode. After scribe lines are scratched in the semiconductor wafer obtained, the wafer will be divided by means of an external force to form LED chips (refractive index 2.1) that are semiconductor light emitting elements.

Next, melted polyphthalamide resin is poured into a closed mold in which a pair of positive and negative lead electrodes are inserted, from a gate corresponding to a lower surface side that is opposite the main surface of the package. The resin is then cured, and the package shown in FIG. 4 is thereby formed. The package has an opening capable of accommodating a light emitting element, and is unitarily formed so that the main surface of either the positive or negative lead electrode is exposed from the bottom surface of the opening. In addition, an inner wall surfaces 101a, 101b, 101c, inner wall surfaces 102, and an inner wall surface 104 are formed on the inner wall surfaces of the opening. Furthermore, a stepped portion is included on a portion of the outer wall surface of the package. In addition, each outer lead of the positive and negative lead electrodes exposed from the package side surface are curved inward on both ends of the surface opposite the light emitting surface.

The LED chip is die bonded on the bottom surface of the opening thus formed with epoxy resin so that a portion of the LED chip extends over the projections 111. Here, the connection material employed in the die bond is not particularly limited, and an Au—Sn alloy, a resin, glass, or the like containing a conductive material can be employed. The conductive material preferably contains Ag, and when an paste is employed containing 80 to 90% Ag, a light emitting device can be obtained in which heat dissipation is superior, and post connection stress will be reduced.

Next, electrical conduction will occur with each electrode of the die bonded LED chip and each lead electrode exposed from the bottom surface of the package opening by means of Au wires.

Next, 3 wt % of precipitated calcium carbonate (refractive index 1.62) having an average particle diameter of 1.0 µm and 70 ml/100 g of absorbed oil is added as a diffusing agent to 100 wt % of a phenyl methyl type silicone resin compound (refractive index 1.53), and is mixed in a rotary mixer for 5 minutes. Next, the mixture is left undisturbed for 30 minutes in order to cool the heat produced by mixing, returned to a constant temperature, and stabilized.

The curable composition obtained is filled into the packaging opening up to a line even with the upper surface of both ends of the opening. Finally, heat treatment is performed for 3 hours at 70° C. and 1 hour at 150° C. In this way, a light emitting surface can be obtained which has an approximately left to right symmetrical parabolic indentation from the upper surface of both end portions of the opening to the central portion thereof.

A sealing material composed of the cured compound is separated into a first layer having a large amount of the diffusing agent, and a second layer having less diffusing agent than the first layer or no diffusing agent at all, and the surface of the LED chip is coated with the first layer. In this way, light emitted from the LED chip can be emitted to the exterior with good efficiency, and light having excellent uniformity can be obtained. It is preferable that the first layer be continuously formed from the bottom surface of the opening to the surface of the LED chip, and in this way, it will be possible to make an opening that will smooth the shape of the light emitting surface.

By having the inner wall surfaces 104 in the opening of the package of the light emitting device of the present example, light from the light emitting element will not be wasted and will be emitted from the inside of the opening in the direction of emitted light observation surface, and can be made thinner than the prior art while shining light in a wide range onto the light input surface of the light guiding plate.

EXAMPLE 9

A light emitting device is formed identical to that described in the example above, except that the sealing material will contain a fluorescent substance (phosphor). The fluorescent substance is coprecipitated with oxalic acid from a solution in which a stoichiometric ratio of the rare earth elements Y, Gd, and Ce are dissolved with acid. The fluorescent substance is then sintered, and the coprecipitated oxide thus obtained is mixed with aluminum oxide to obtain a mixed compound. Barium fluoride is mixed therein as a flux, and then is packed into a crucible, and sintered in the presence of air at 1400° C. for three hours to obtain a sintered product. The sintered product is then processed in a ball mill in the presence of water, and a $(Y_{0.005}Gd_{0.005})_{2.750}Al_5O_{12}:Ce_{0.250}$ fluorescent material having a centric particle diameter of 8 µm will be formed via washing, separating, drying, and finally sieving. By containing a fluorescent material, a light emitting device can be made in which mixed light is obtained that is composed of light from the light emitting element, and light in which a portion of the light of the light emitting element is converted to long wavelengths by the fluorescent material.

The white emitted light obtained by the light emitting device of the present invention was evaluated, and was shown to have an intensity of 1012 mcd.

In comparison, the intensity was 970 mcd with a light emitting device that was identical to that described above, except that the ITO film formed on the light emitting element mounted thereon had no voids in the vicinity of the interface of the semiconductor layer side of the ITO film, and had excellent crystallinity and density in the entirety of the ITO film.

EXAMPLE 10

The light emitting device obtained in Example 9 is combined with a light guiding plate to form a planar light emitting device. The light emitting device and the light guiding plate are directly adhered to each other.

A planar light source of this example can be easily aligned with the light emitting device, and can be made thinner than conventional planar light sources. In addition, by providing a cut-out portion that scatters light on the light input surface of the light guiding plate, a planar light source can be made that will not produce non-uniform light.

EXAMPLE 11

Figure 9:
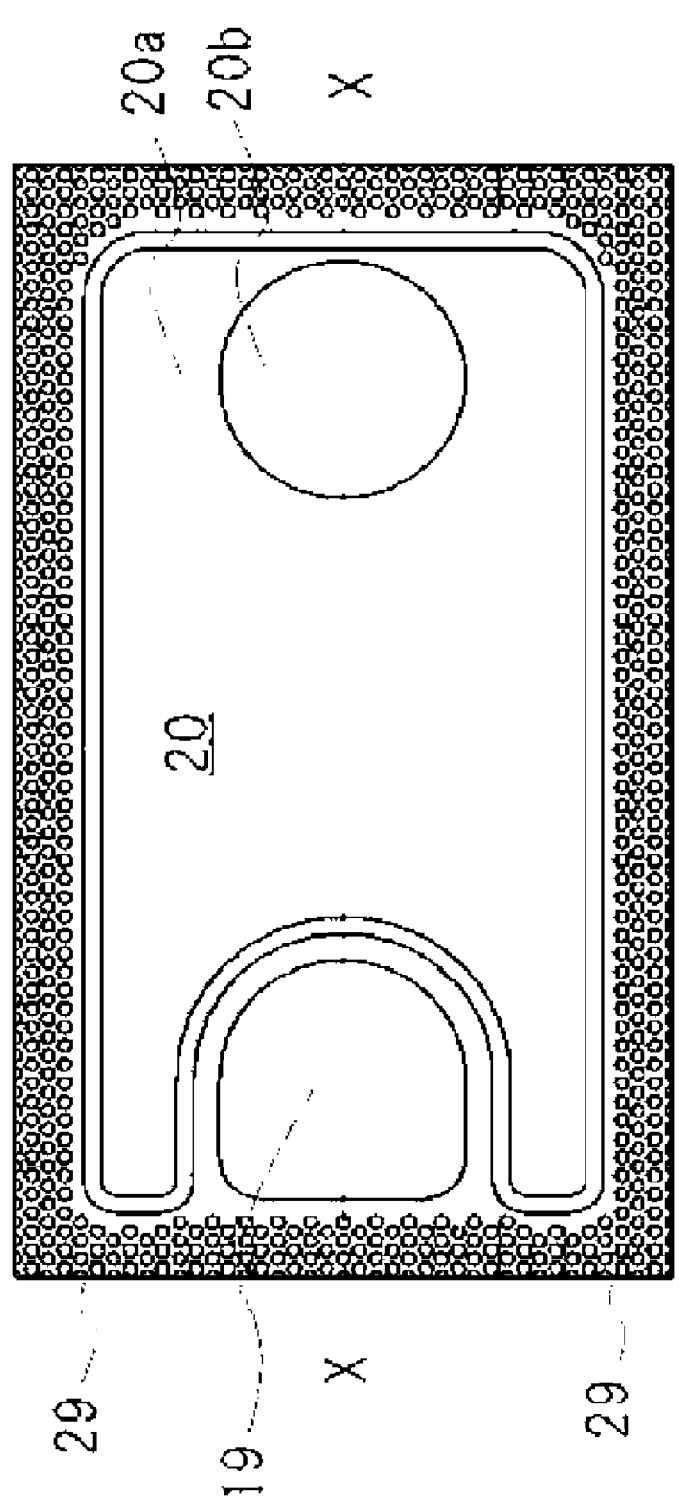
FIG. 9 is a plan view which describes the shape of electrodes of the semiconductor light emitting element according to Example 111 of the present invention.
Figure 10:
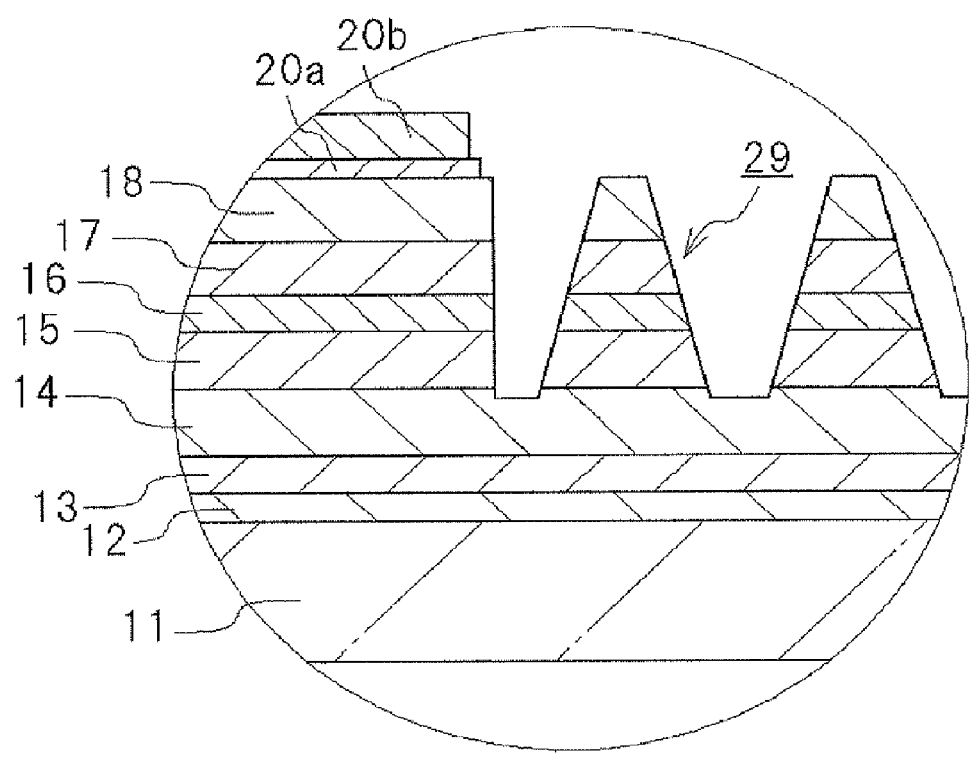
FIG. 10 is a partial cross-section of the semiconductor light emitting element of FIG. 9.

FIG. 9 shows a plan view of a semiconductor light emitting element of this example viewed from the electrode formation surface side thereof, and FIG. 10 shows a cross-section thereof taken along line X-X in FIG. 9. Note that FIG. 10 is a cross-section in the vicinity of a pad electrode 20*b* of a p-side electrode 20 (hereinafter also referred to as the "p-side pad"), and shows the positional relationship between the semiconductor laminated structure of a first region provided on the p-side electrode 20, and projections 29 arranged on a second region thereof.

The p-side electrode 20 and an n-side electrode 19 of the semiconductor light emitting element are arranged on the same planar side thereof, and the semiconductor light emitting element is a structure that will extract light from the electrode formation surface side thereof (the observation surface side thereof).

The semiconductor laminated structure that forms the semiconductor light emitting element is the same as the semiconductor laminated structure (2) described above, and has a laminated structure in which a GaN buffer layer 12, an undoped GaN layer 13, an Si doped GaN layer 14 that will become an n-type contact layer, an Si doped GaN layer 15 that will become an n-type clad layer, an InGaN layer 16 that will become an active layer, an Mg doped AlGaN layer 17 that will become a p-type clad layer, and an Mg doped GaN layer 18 that will become a p-type contact layer, are sequentially laminated onto a sapphire substrate 11. Furthermore, the Mg doped GaN layer 18, the Mg doped AlGaN layer 17, the InGaN layer 16, the Si doped GaN layer 15, and the Si doped GaN layer 14 will be partially removed by etching or the like, the n-side electrode 19 will be formed on the exposed surface of the Si doped GaN layer 14, and the p-side electrode 20 will be arranged on the Mg doped GaN layer 18.

The n-side electrode 19 is sequentially laminated with W, Pt, and Au from the n-type contact layer side.

A current diffusion portion 20*a* of the p-side electrode 20 (hereinafter also referred to as the "p-side current diffusion portion") is formed on substantially the entire surface of the p-type contact layer and connected thereto, and is formed by an ITO film identical to that of Example 1. Like with the n-side electrode, the pad 20*b* is sequentially laminated with W, Pt, and Au.

Thus, by forming the p-side pad 20*b* and the n-side electrode 19 to have the same structure, the process of forming the p-side pad 20*b* will be the same as that of the n-side electrode 19. In addition, the n-side pad electrode may employ ITO in the same way as the p-side current diffusion portion.

In this example, the p-side current diffusion portion 20*a* partially surrounds the n-side electrode 19 in order to secure a light emitting region (the first region).

The projections 29 of the semiconductor light emitting region form a plurality of pits and projections, and surround the periphery of the first region. In other words, the electrode formation surface side surface region of the semiconductor light emitting element can be effectively used to control light extraction efficiency and light directivity by forming projections around the periphery of the first region that emits light when driven.

In general, after the semiconductor layers are laminated onto a substrate such as sapphire or the like, a thin film process is performed on predetermined regions, and individual semiconductor light emitting elements are separated by means of the thin film regions. In this example, a special region for forming the projections may be provided, but for example, by forming thin film regions that divide the wafer, or a plurality of projections around the n-electrode, an increase in the number of process steps can be prevented. In other words, it is preferable to form the projections of the present example in a desired region of a flat n-type contact layer that is arranged on the electrode formation surface side.

Here, viewed from the electrode formation surface side, the n-type contact layer is formed from a first region on which a semiconductor laminated structure having a p-side electrode is arranged, and a second region that is different from the first region. The n-electrode 19 and the plurality of projections 29 are arranged on the second region. As shown in FIG. 10, in the cross section of the semiconductor light emitting element, the top of each projection arranged on the second region is at the p-type contact layer side of the active layer, and preferably formed so as to be substantially the same height as the p-type contact layer. In other words, the top of each projection is formed so as to be higher than the active layer. In addition, the bottom portions between the projections are preferably formed so as to be lower than the active layer. This semiconductor light emitting element is a DH structure (double hetero structure), and thus the tops of the projections may be higher than at least the interface between the active layer and the n-side layer adjacent thereto, but it is more preferable that the tops of the projections be higher than the interface between the active layer and the p-side layer adjacent thereto. In addition, the bottom portions between the projections may be lower than at least the interface between the active layer and the p-side layer adjacent thereto, but it is more preferable that the bottom portions between the projections be lower than the interface between the active layer and the n-side layer.

By forming the semiconductor light emitting element in this manner, the efficiency at which light is extracted toward the observation surface side can be improved by, for example, 10 to 20%. The reasons for this are not clear, but it is thought to be due to the following:

1. Light guided inside the n-type contact layer is taken from the n-type contact layer into the projections, and is then extracted from the tops of the projections or the lower portions thereof to the observation surface side.

2. Light radiating out from the active layer edge surfaces to the exterior side surfaces is reflected and diffused by the plurality of projections, and is then extracted toward the observation surface side.

3. Light guided inside the n-type contact layer is irregularly reflected by the bases of the projections (the portions that connect the projections with the n-type contact layer), and is then extracted toward the observation surface side.

In addition, by providing a plurality of projections, uniform light extraction will become possible across the entire region of the observation surface side.

Furthermore, by forming the projections so as to include the p-type contact layer, the tops thereof will be approximately the same height, and thus light can be effectively extracted from the tops of the projections to the observation surface side without the first region on which the semiconductor laminated structure having the p-side electrode being cut off.

In addition, by forming the projections so that they are higher than the p-type contact layer, and preferably higher than the p-type electrode, the light can be more effectively extracted.

Furthermore, the aforementioned effects will become even greater by inclining the projections, in cross-section, in the direction of the semiconductor laminated layers, i.e., from the n-type contact layer side toward the p-type contact layer side, so that they become gradually narrower. In other words, by intentionally applying an angle to the projections, light from the active layer will be completely reflected on the surface of the projections, or the light guided by the n-type contact layer will be diffused, and as a result, light extraction toward the observation surface side can be performed more effectively. The angle of inclination of the projections is preferably 30 to 80°, and more preferably 40 to 70°.

The projections can have a variety of shapes in cross-section, such as conical, semicircular, and the like, but are preferably trapezoidal, i.e., the projections preferably have a conical trapezoid shape. By forming the projections in this way, not only can directional control of the light be made easier, but the light extraction can be made more uniform as a whole. When light is emitted from the p-type contact layer, and the p-side contact layer is the observation surface, it is though that these effects are obtained by including a flat surface on the observation surface side of the projections and not a pointed tip.

In addition, when the shape in cross-section of the projections are trapezoidal, an indentation can be provided on the upper part of the trapezoid. In this way, when light guided inside the n-type contact layer enters into the interior of the projections, light will be easily emitted on the observation surface side by means of the indentations formed in the tops of the projections, and is thus preferred.

Furthermore, it is preferable that two or more, and preferably 3 or more projections are at least partially duplicated and arranged in a direction approximately perpendicular to the emission end surfaces of the semiconductor laminated structure formed on the first region of the n-type contact layer. In this way, light from the first region will travel through the projections with high efficiency, and thus the aforementioned effects can be obtained even more easily.

In order to form the n-side electrode, the projections are preferably formed when the n-type contact layer is exposed. In other words, because the semiconductor light emitting element of the present example is a structure in which the p-side electrode and the n-side electrode are on the same planar side, after the p-type contact layer is laminated onto the substrate, it will be necessary to remove at least the region corresponding to the n-side electrode from the p-side of the semiconductor laminated structure so that the n-type contact layer will be exposed. For example, after laminating the p-type contact layer, a resist layer will be applied to expose the desired pattern, the remaining resist film will be employed as a mask, and except for the position where the p-side electrode will be provided (the first region), and the position where the projections are to be formed (a portion of the second region), the p-type contact layer will be removed by etching until the n-type contact layer is exposed. In this way, the process can be simplified, because the exposed surface on which the n-side electrode will be formed can be formed simultaneously with the projections. Note that although the resist layer is employed here as a mask, an insulating film such as $SiO_2$ and the like may also be employed as a mask.

The projections formed in this manner comprise the same laminated structure as the semiconductor laminated structure in the first region. Thus, although the active layer that is included in the first region will function as a light emitting layer, the active layer that is included in the projections of the second region will not function as a light emitting layer. This is due to the fact that the p-side electrode is not formed on the second region (projections), but rather is in the first region. In other words, a carrier is supplied in the active layer of the first region (electron holes and electrons) by charging with electricity, but a carrier is not supplied in the active layer of the projections arranged in the second region by charging with electricity. Thus, the projections are not capable of emitting light by themselves.

In addition, although it is also possible to provide holes surrounded entirely by the first region in the interior of the first region, and to provide a plurality of projections that cannot emit light in each of the holes, in this situation there will be times in which the current route will be hindered, and thus not only will the resistance of the element tend to increase, but uniform light emission may not be obtained, and thus is not preferred. Thus, it is preferable that at least an n-type contact layer, an active layer, and a p-type contact layer necessary for light emission be uniformly laminated in the region that is originally meant to emit light (the first region), and light is uniformly emitted therefrom, and preferable that the plurality of projections be provided only in the region that is originally not meant to emit light (the second region). Regardless, by providing the plurality of projections in the region in which light cannot be originally emitted, and effectively using the region in which light cannot be originally emitted, the aforementioned effects can be obtained.

In addition, the projections formed as above have the same laminated structure as the semiconductor laminated structure in the first region, i.e., the projections are composed of a plurality of layers of different materials. If the materials are different, then because each layer will naturally have a different refractive index, it is thought the light that is taken into the projections will easily reflect off each interface, and as a result, will contribute to an increase in light extraction toward the observation surface side.

Furthermore, the number, the density, and the like of the projections in the present invention is not particularly limited, and there can be at least 100 or more in the second region, preferably 200 or more, more preferably 300 or more, and even more preferably 500 or more. In this way, the aforementioned effects can be improved even more. Note that viewed from the electrode formation surface side, the percentage of the surface area of the second region occupied by the projections (more particularly, the percentage of the surface area occupied by the interface between the projections and the second region) can be 20% or more, preferably 30% or more, and more preferably 40% or more. Note that the upper limit is not particularly defined, however it is preferably set to 80% or less. In addition, the surface area of the interface between one projection and the second region can be 3 to 300 $\mu m^2$, preferably 6 to 80 $\mu m^2$, and more preferably 12 to 50 $\mu m^2$.

Thus, the semiconductor light emitting element of this example will reduce the light that is emitted in the horizontal direction (the side surface directions of the semiconductor light emitting element), and will selectively radiate light upward (the observation surface side). In particular, in a semiconductor light emitting element having a structure (i.e., a double hetero structure) in which an active layer is interposed between layers having refractive indexes that are lower than the active layer, light will be trapped in between the layers having the low refractive indexes, and thus most light will inevitably travel in the side surface directions. The present invention is particularly effect with respect to this type of element.

Furthermore, when the semiconductor light emitting element is actually used, generally, the periphery thereof is sealed with a sealing resin composed of an organic resin such as, for example, an epoxy resin, silicone resin, and the like, and resin curing with light can be sharply reduced. This is thought to be due to the fact that light from the active layer side surfaces is not focused on the sealing resin located on the active layer side surfaces, and is diffused due to the plurality of projections. In particular, because epoxy resin is weak with respect to light, it is particularly effective as a sealing resin in a semiconductor light emitting element. Likewise, even when a support member composed of an organic resin (e.g., a nylon type resin) is provided in the semiconductor light emitting element, the lifespan of the support member can be extended. In other words, by employing this type of semiconductor light emitting element, deterioration of the support element by light emitted from the semiconductor light emitting element side surfaces can be sharply reduced. This type of effect will naturally become more conspicuous the closer the surface of the support member is to the semiconductor light emitting element.

Note that the semiconductor light emitting element can, like in Example 8, be a surface mounting (SMD) type of light emitting device shown in FIG. 8.

EXAMPLE 12

Figure 11:
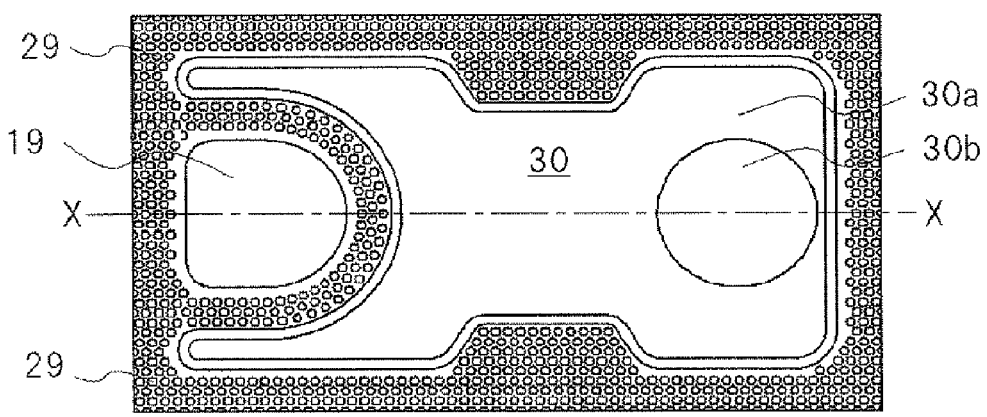
FIG. 11 is a plan view which describes the shape of electrodes of the semiconductor light emitting element according to Example 12 of the present invention.

As shown in FIG. 11, the semiconductor light emitting element of this example is identical to the semiconductor light emitting element of Example 11, except that the shape of the semiconductor laminate structure in the first region, the shape of the p-side current diffusion portion 30*a* in accordance therewith, and the formation region of the projections 29, are different.

In other words, the first region of this semiconductor light emitting element, viewed from the electrode placement surface, includes constricted portions that are located between the n-side electrode 19 and the pad portion of the p-side electrode 30, and a plurality of projections are formed on these constricted portions. In other words, viewed from the electrode placement surface side, the semiconductor laminate structure arranged on the first region located between the n-side electrode and the pad portion of p-side electrode has, in a direction perpendicular to a straight line that connects the n-side electrode and the pad portion of the p-side electrode, constricted portions on both sides of the first region, and a plurality of projections are arranged on the constricted portions. In this way, light generation and light emission toward the observation surface side can be effectively performed.

More specifically, the pad portion 30*b* of the p-side electrode and the n-side electrode 19 of this semiconductor light emitting element are arranged on a line X-X. Then, as shown in FIG. 11, viewed from the electrode formation surface side, the p-side current diffusion portion 30*a* is formed into a longitudinal shape along the line X-X, and the semiconductor light emitting element is also formed into a longitudinal shape along line X-X in accordance therewith. In addition, electric current that flows from the pad portion 30*b* of the p-side electrode to the n-side electrode 19 will flow primarily on line X-X so as to take the shortest route. However, in the p-side current diffusion portion 30*a* between the pad portion 30*b* of the p-side electrode and the n-side electrode 19, it will be difficult to supply electric current to the regions separated from the line X-X, the pad portion 30*b* of the p-side electrode, and the n-side electrode 19, and as a result, light emission will be weaker than compared to other regions.

Considering the aforementioned situation, by arranging the constricted portions on the first region located between the n-side electrode 19 and the pad portion 30*b* of the p-side electrode, removing the regions of the semiconductor laminate structure corresponding to the constricted portions that are meant to generate light, and forming a plurality of projections on the restricted portions, excellent light emission can be achieved as a result. It is thought that by removing the weak light generating regions that correspond to the constricted portions, and arranging projections on the removed regions, strong light emissions will radiate as is from the exterior side surfaces, and will be redirected toward the observed surface side via the projections, and thus will improve the ability to control light extraction and directionality.

In addition, with this semiconductor light emitting element, projections 29 are formed between the n-side electrode 19 and the first region. The light emitted around the periphery of the n-side electrode is comparatively strong, and thus by providing the projections 29 between the n-side electrode 19 and the p-side electrode diffusion portion 30*a*, the effects of Example 11 can be further improved.

Furthermore, for example, a plurality of projections may be arranged at a high density near the n-side electrode and the first region where the light emission is comparatively strong, and a plurality of projections may be arranged at a low density in regions different therefrom in which the light emission is comparatively weak. The regions where light emission is strong and where it is weak will differ depending upon the structure of the semiconductor light emitting element, but regardless of this, by considering the strength of the light emission region, and changing the density of the plurality of projections, more effective light extraction and directionality control will be possible.

Note that the semiconductor light emitting element can, like in Example 8, be a surface mounting (SMD) type of light emitting device shown in FIG. 8.

EXAMPLE 13

Figure 12:
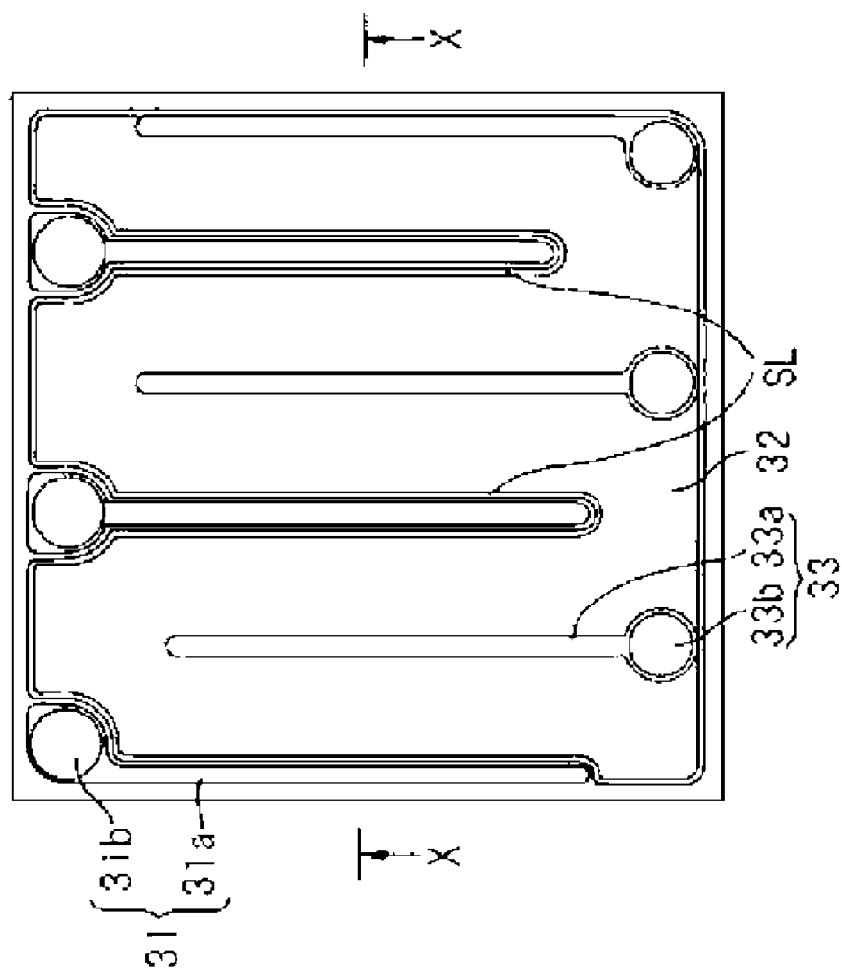
FIG. 12 is a plan view which describes the shape of electrodes of the semiconductor light emitting element according to Example 13 of the present invention.
Figure 13:
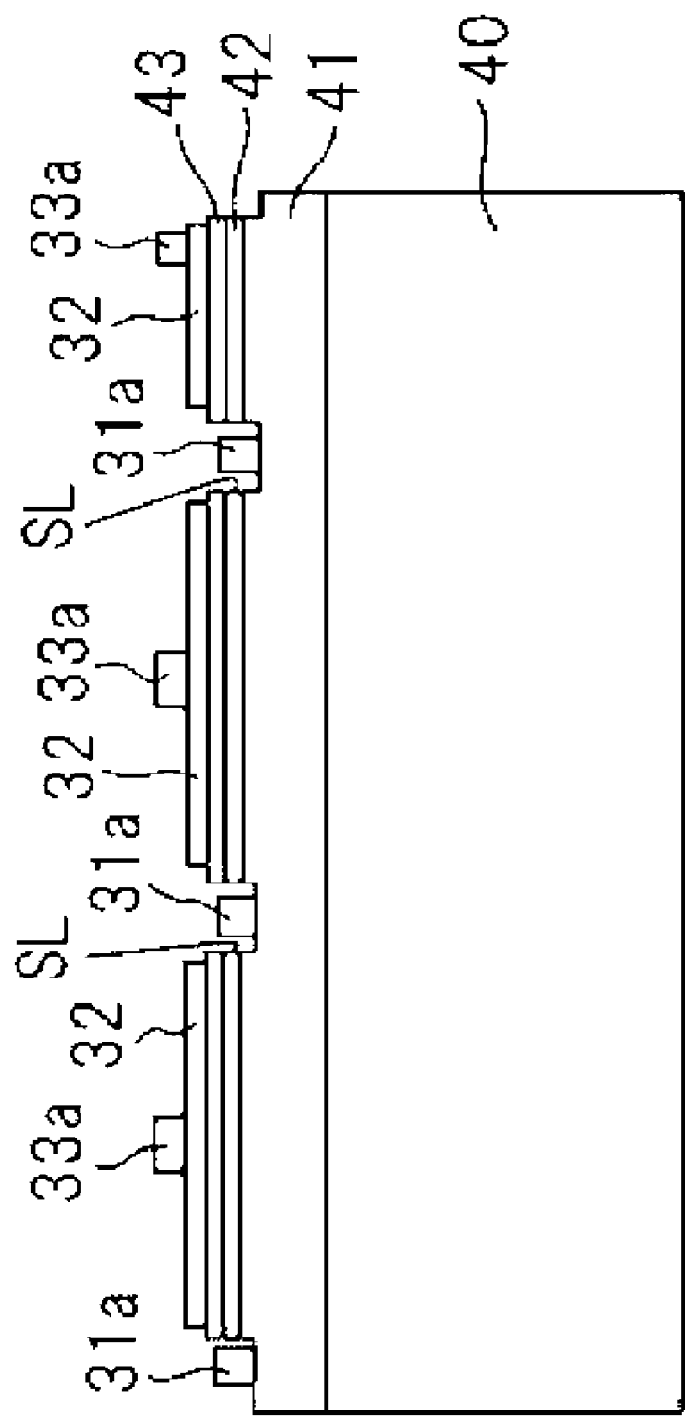
FIG. 13 is a cross-section taken along line X-X' of the semiconductor light emitting element of FIG. 12.

The semiconductor light emitting element of this example, as shown in the plan view of the electrode side in FIG. 12 and the cross-sectional view along line X-X' in FIG. 13, has an n-type layer 41, an active layer 42, and a p-type layer 43 laminated in this order on a sapphire substrate 40.

The n-type layer 41 has exposed portions on a portion of the surface thereof, and a plurality of mutually isolated n-line electrodes 31 are formed on the exposed portions.

In other words, a plurality of slits SL are formed in a laminated material composed of the n-type layer 41, the active layer 42, and the p-type layer 43 by removing portions of the p-type layer 43 and the active layer 42 in line shapes, and n-line electrodes 31 are formed on the n-type layer exposed by the slits SL. In addition, the n-type layer is exposed at a predetermined width along one edge that is parallel with the slits (the one edge of the light emitting element is hereinafter referred to as the first edge), and one n-line electrode 31 is formed thereon. Note that the n-type layer surface along the first edge that is exposed at a predetermined width and on which the n-line electrode is formed will be referred to as the first region, and the n-line electrode formed on the first region will be referred to as the first n-line electrode. In addition, the edge opposite the first edge will be referred to as the second edge.

With this semiconductor light emitting device, the first region and the plurality of slits SL are formed so as to be mutually parallel, and the gap between the first region and the slits SL and the gap between the adjacent slit SL are formed to be mutually equal.

Each n-line electrode 31 is formed of a line-shaped ohmic electrode 31*a* and an n-pad electrode 31*b* that is arranged on one end of the line-shaped ohmic electrode 31*a*. The n-pad electrodes 31b arranged on the end of each line-shaped ohmic electrode is formed along one edge (the third edge) at a right angle to the first edge.

In addition, one end of the line-shaped ohmic electrode 31a is widely formed in order to form the n-pad electrode 31b, and the n-pad electrode 31b is formed thereon.

A p-side electrode is formed from a transparent p-ohmic electrode 32 formed on approximately the entire surface of the p-type layer, and a plurality of current diffusion electrodes 33 that are formed on the p-ohmic electrode 32. Note that the p-ohmic electrode 32 is formed as a transparent electrode layer by means of the same ITO as in Example 1. The current diffusion electrodes 33 are formed from the line-shaped ohmic electrodes 31a, a plurality of diffusion line electrodes 33a, and p-pad electrodes 33b that are arranged on one end of each diffusion line electrode 33a. The gaps between the diffusion line electrodes 33a and the adjacent n-line electrodes 31 are formed so as to be mutually equal, one of the plurality of diffusion line electrodes 33a is formed along the second edge, and the other diffusion line electrodes 33a are formed between the n-line electrodes 31. In other words, when an n-line electrode is formed along one of the two opposing edges (the first edge), a current diffusion electrode 33 will be formed along the other opposing edge. In addition, the p-pad electrodes 33b arranged on one end of each diffusion line electrode 33a are formed along a fourth edge opposite the third edge on which the n-pad electrodes 31b are formed.

This type of semiconductor light emitting element will, for the following reasons, infuse the entire light emitting region with electric current and improve light extraction efficiency, and will also make it possible for uniform light emission to occur across the entire light emitting surface, even with a nitride semiconductor light emitting element with a relative large surface area (e.g., 1000 μm×1000 μm).

First, the n-pad electrodes 31b are respectively formed on one end of each n-line electrode 31, and the p-pad electrodes 33b are respectively formed on one end of each diffusion line electrode 33a. In this way, electric current can be approximately uniformly infused in the entire light emitting region.

Note that with this semiconductor light emitting element, between different n-line electrodes 31, the distance from the n-pad electrodes 31b to the other ends of the line-shaped ohmic electrodes 31a can be substantially equal, and between different current diffusion electrodes 33, the distance from the p-pad electrodes 33b to the other ends of the diffusion line electrodes 33a can be substantially equal, and thus electric current can be uniformly infused into the entire light emitting region.

Here, the aforementioned distance being substantially equal does not mean an exact match, and includes a substantially equal range in which non-uniform current due to differences in distance is not produced.

Second, the gaps between the adjacent n-line electrodes 31 and the p-side of the current diffusion electrodes 33 are equal, and thus electric current will be uniformly infused into the entire light emitting region.

In other words, the line-shaped ohmic electrodes 31a and the diffusion line electrodes 33a are formed in straight lines such that angled portions and curved portions are not formed along the electrodes, and thus concentrated electric fields and non-uniform electric fields in angled portions and curved portions will be prevented, and non-uniform electric current will be accordingly be prevented.

In addition, the distances between the other ends of the diffusion line electrodes 33a (the ends located on the side opposite the ends on which the p-pad electrodes 33b are formed), and the n-pad electrodes 31b (the ends of the n-line electrodes 31 on which the n-pad electrodes 31b are formed) are set to be approximately equal with the gaps between the diffusion line electrodes 33a and the n-line electrodes 31.

Furthermore, the distances between the other ends of the n-line electrodes 31 (the ends located on the side opposite the ends on which the n-pad electrodes 31b are formed), and the p-pad electrodes 33b (the ends of the diffusion line electrodes 33a on which the p-pad electrodes 33b are formed) are set to be approximately equal with the gaps between the diffusion line electrodes 33a and the n-line electrodes 31.

Thus, because the distances between the current diffusion electrodes 33 and the n-line electrodes 31 can be substantially equal at any portion thereof, electric current can approximately uniformly infused into the entire light emitting region, and uniform light emission will be made possible.

When the substrate 40 side is a light extraction surface, an electrode structure can be provided in which a reflection film is arranged on the p-ohmic electrode 32, or a reflective electrode layer is arranged on the p-ohmic electrode 32. When the light extraction surface is either the substrate 40 side or the p-type layer 43, the p-ohmic electrode 32 is preferably a single layer structure composed of ITO or a multi-layer structure that includes this. In addition, the line-shaped ohmic electrode 31a may be a single layer structure composed of the ITO that forms the p-ohmic electrode 32 or a multi-layer structure that includes this.

Figure 14A:
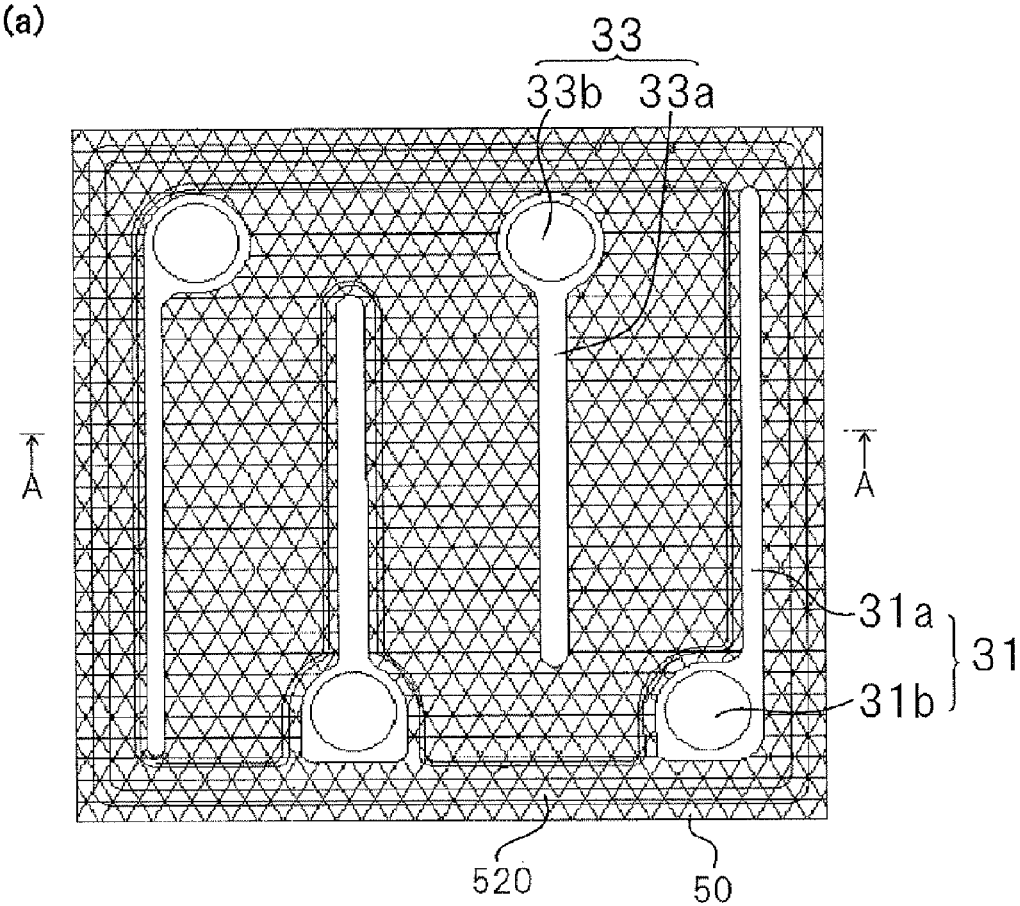
FIG. 14 is a plan view and a cross-section taken along line A-A' which describes the shape of electrodes of the semiconductor light emitting element of the present invention.
Figure 14B:
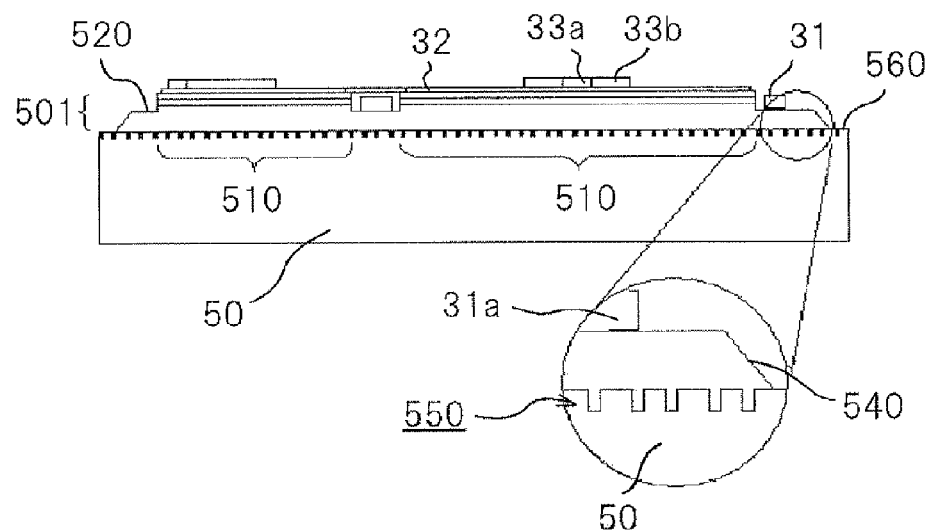

Note that a modification of the semiconductor light emitting element of this example, as shown in FIGS. 14(a) and (b), may be a structure in which a concave/convex portion is provided on the interface between a substrate 50 and a first conductive type layer 520 of an element structure 501, a side surface 540 is provided as a inclined surface on the first conductive type layer 520 on the outside of a light emitting structure 510, and an exposed portion 560 is provided on the outside of the side surface 540 in which the substrate 50 is exposed. In this way, light will be irregularly reflected on the interface of the substrate 50 by the concave/convex portion 550 and thus improve the extract efficiency, and furthermore, light primarily transmitted in the horizontal direction inside the first conductive type layer 520 will be reflected by the inclined side surface 540, and will contribute to light extraction from the substrate 50 side and will increase the output.

EXAMPLE 14

Figure 15:
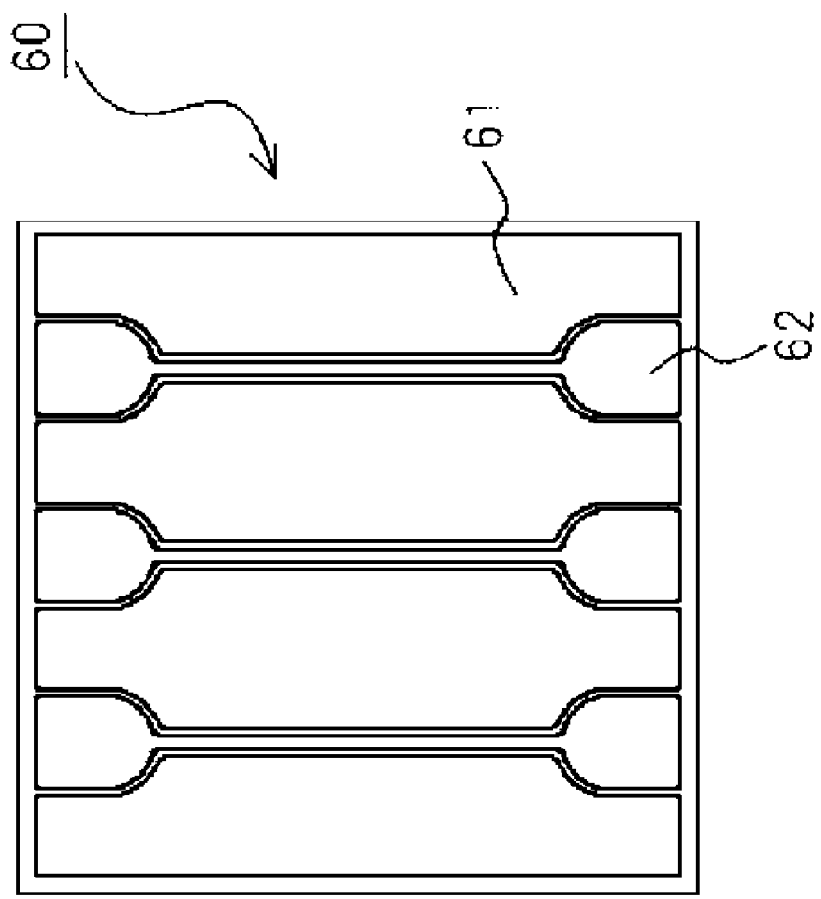
FIG. 15 is a plan view which describes the shape of electrodes of the semiconductor light emitting element according to Example 14 of the present invention.

With the semiconductor light emitting element 60 of this example, as shown in the plan view of the electrode formation surface side of FIG. 15, an n-type semiconductor layer is exposed in a stripe shape by etching between the p-type semiconductor layer. The stripes of the exposed n-type semiconductor layer are narrow in the inner side of the element, and n-electrodes 62 are formed on the exposed n-type semiconductor layer. Note that a p-side diffusion electrode 61 is stripe shaped, and the stripes are wider than the width of the exposed n-type semiconductor layer in the central portion of the light emitting element. Note that the p-side diffusion electrode 61 is formed by means of the same ITO as in Example 1. The number of stripes of the p-side diffusion electrode 61 is greater than the number of stripes of the n-electrodes 62 on the n-type semiconductor layer.

Thus, the surface area of the p-side diffusion electrode 61 can be increased by the n-electrodes 62 having a constricted shape, and thus the amount of electric current input into the light emitting element per unit time can be enlarged. Furthermore, on the light emitting surface, the surface area of the n-type semiconductor layer that does not contribute to the light emission of the light emitting element can be reduced, and thus the light extraction efficiency of the light emitting element can be improved by relatively increasing the surface area of the p-type semiconductor layer. Thus, with this light emitting element, high luminosity can be achieved. In addition, by providing the diffusion electrode 61, the electric current input into the light emitting element can be uniformly diffused in the entire surface of the light emitting element, and thus the light emissions from the light emitting surface of the light emitting element can be made uniform.

Note that the metal film formed on the p-side diffusion electrode and the n-electrodes preferably contain at least one type of material that is contained in the projections. For example, when the projections are made of Au, the material of the p-side metal film and the n-electrodes, particularly the material of the connection surfaces that connect with the projections, is preferably Au or an alloy that contains Au. In addition, the material may be a single layer or multi-layer film of Ag, Al, Rh, Rh/Ir.

Furthermore, when the light emitting element is to be flip chip mounted, the electrode material of the submount that faces the electrodes of the light emitting element and electrode material of the support substrate is preferably a silver colored material having high reflectivity, e.g., silver, aluminum, or an alloy containing at least one or more of these metals and another metal.

When the p-side diffusion electrode and the n-electrodes are formed from the same material, it will be possible to form them simultaneously, and simplify the manufacturing process, and is thus preferred.

EXAMPLE 15

Figure 16:
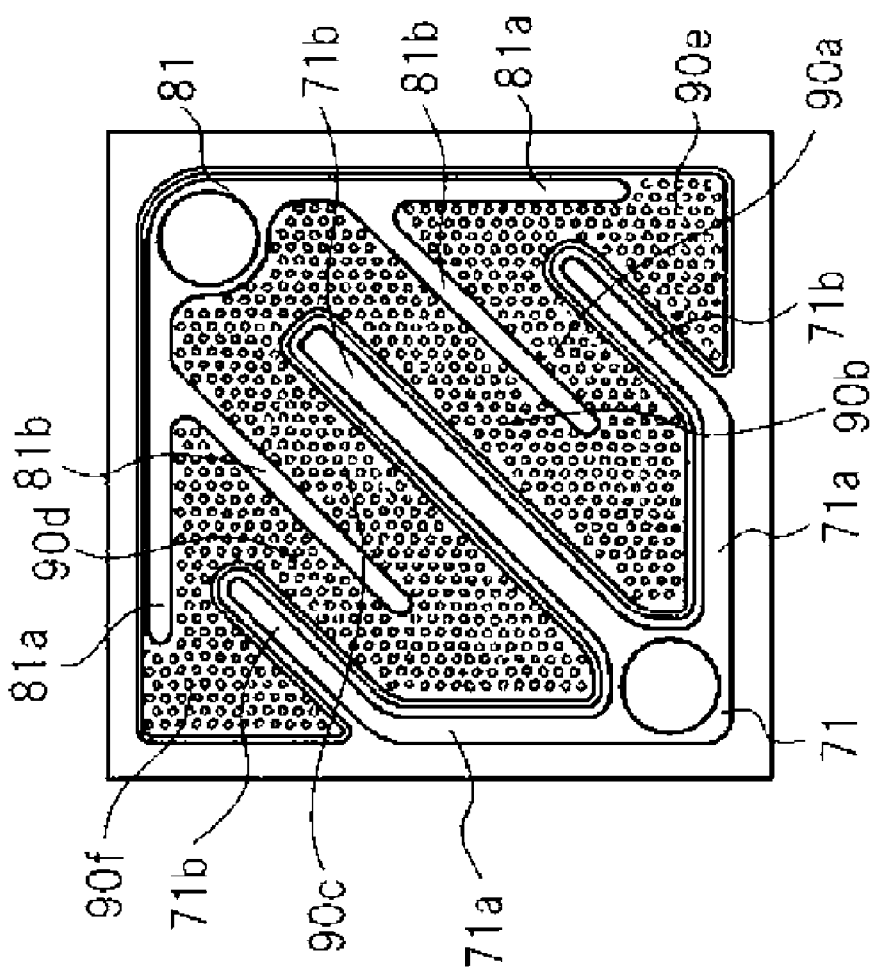
FIG. 16 is a plan view which describes the shape of electrodes of the semiconductor light emitting element according to Example 15 of the present invention.

With this semiconductor light emitting element, as shown in FIG. 16, an n-electrode 71 is formed from a first extension 71a that is arranged along an outer periphery that includes one corner of the light emitting element, and second extensions 71b that extend from the ends and corner portion of the first extension 71a toward the inner side of the light emitting element. Note that the surface of the n-type semiconductor layer is exposed in approximately the same shape as that of the n-electrode 71, and the n-electrode 71 is formed on that surface.

In addition, a p-type semiconductor layer is arranged on the surface of the semiconductor light emitting element other than the region where the n-type semiconductor layer is exposed, and a transparent electrode 82 composed of the same ITO as in Example 1 is formed on approximately the entirety of that surface. In addition, a pad electrode composed of a peripheral edge electrode 81a composed of a metal film arranged along the outer periphery that includes a corner portion that is opposite the corner portion in which the n-electrode is formed, and extensions 81b that extend from the middle of the peripheral edge electrode 81a toward the inner side of the light emitting element, are formed on the transparent electrode 82, and a p-electrode 81 will be formed with this pad electrode and the transparent electrode 82.

In other words, by arranging the extensions 81b that form the p-electrode 81 between and approximately parallel with the second extensions 71b that form the n-electrode 71, light emitting portions 90a to 90d will be arranged so as to be interposed between the second extensions 71b and the extensions 81b. In addition to the light emitting regions 90a to 90d, light emitting regions 90e, 90f are respectively formed in the corners in which the n-electrode 71 and the p-electrode 81 are not formed, in regions that are surrounded by the tips of the peripheral edge electrode 81a and the second extensions 71b.

The electric current input into the light emitting element can be uniformly diffused in the entire surface of the light emitting element by means of the shape of the electrodes, and thus the light emissions from the light emitting surface of the light emitting element can be made uniform.

EXAMPLE 16

Figure 17:
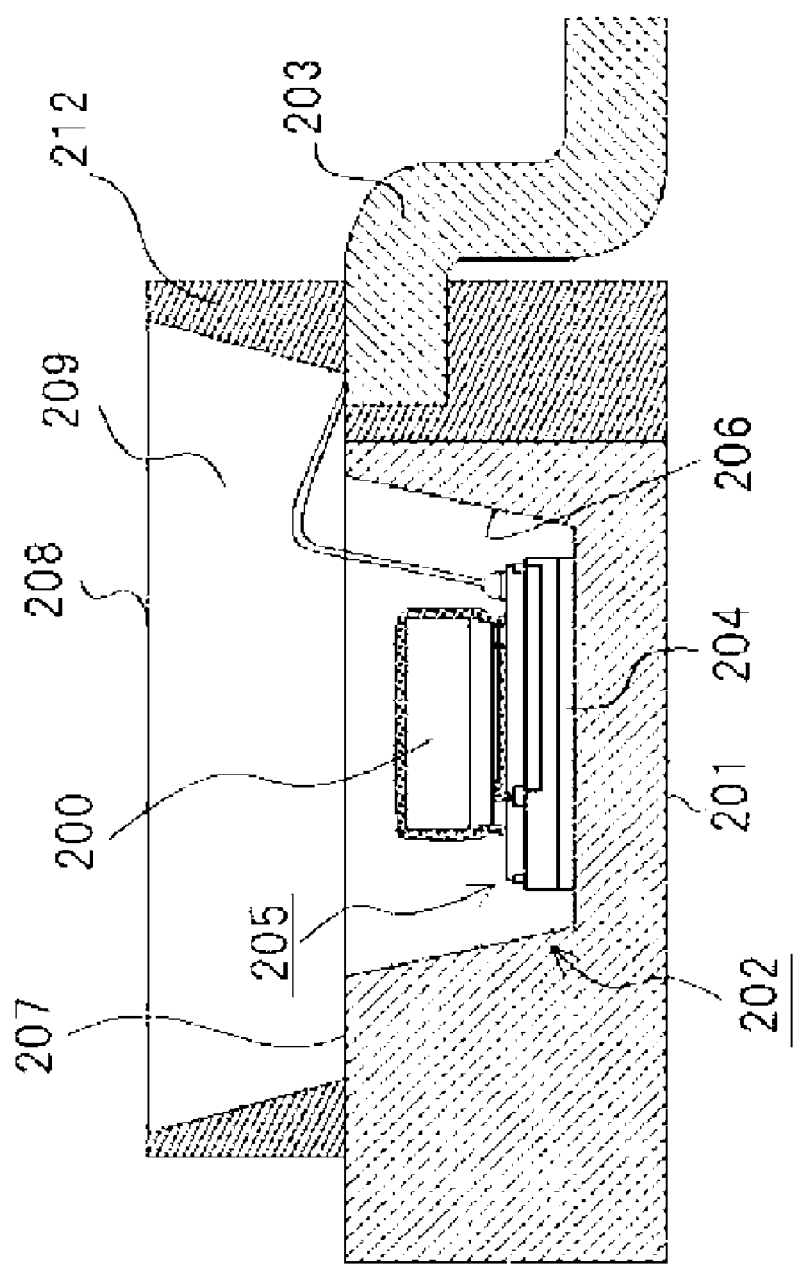
FIG. 17 is a cross-section of a light emitting device which employs the semiconductor light emitting element according to Example 16 of the present invention.

In this example, as shown in FIG. 17, an LED chip 200 that is the semiconductor light emitting element having the diffusion line electrodes and the n-line electrodes shown in Example 13, formed a light emitting device by means of flip chip mounting on a mounting base 201. This light emitting device is formed by mounting the LED chip 200 mounted onto a submount substrate 205, via an adhesive layer 204, in an indentation of a package 212 that includes a mounting base 201 having a lead 203 fixed thereto. The side surfaces of the indentation 202 functions as a reflection portion 206, the mounting base 201 functions as a heat dissipation portion, and are connected to an external heat sink (not shown in the figures). In addition, a terraced portion 207 is formed in the mounting base 201 on the outside of the indentation 202, and a protective element (not shown in the figures) is mounted here. An opening is formed as a light extraction portion 208 above the indentation 202 of the mounting base 201, and a transparent sealing material 209 is embedded into the opening to thereby seal it.

EXAMPLE 17

Figure 18:
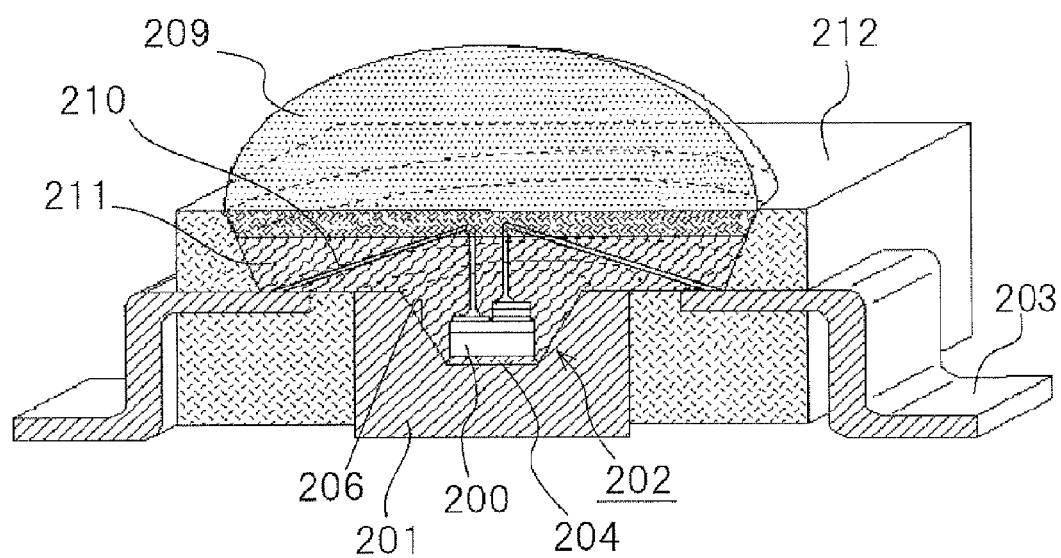
FIG. 18 is a cross-sectional oblique view of a light emitting device which employs the semiconductor light emitting element according to Example 17 of the present invention.

In this example, as shown in FIG. 18, an LED chip 200 that is the semiconductor light emitting element having the diffusion line electrodes and the n-line electrodes shown in Example 13, formed a light emitting device by means of face down mounting on a mounting base 201.

This light emitting device has an LED chip 200 fixed, via an adhesive layer 204, in an indentation 202 of a package 212 that includes the mounting base 201 that is discretely insulated from a lead 203. The inner surfaces of the indentation 202 function as a reflection portion 206, and preferably has a shape (taper shape) that becomes wider toward the opening. This shape allows light from the LED chip 200 to be reflected on the side surfaces of the indentation 202 toward the front of the package, and thus can improve the light extraction efficiency. The mounting base 201 can be formed by means of a glass epoxy resin, ceramic, or the like. In addition, the adhesive layer 204 can employ a thermosetting resin such as an epoxy resin, an acryl resin, an imide resin, and the like. The mounting base 201 functions as a heat dissipation portion, and is connected to an external heat sink (not shown in the figures). Thus, a light emitting device having a superior thermal design can be obtained by means of a structure that allows the mounting base 201 and the leads 210 to be separated, and heat dissipation to be maintained.

In addition, a transparent sealing material 209 is embedded inside the indentation 202 of the mounting base 201 and above the same, and forms an optical lens shape. By providing an optical system (lens), a desired light emission directionality can be obtained.

Furthermore, the electrodes of the LED chip 200 are electrically connected to the leads 203 by wires 210, and extend to the outside of the package.

Note that a surface 211 inside the indentation 202 of the mounting base 201 can, by means of embossing or plasma treatment, improve adhesiveness by increasing the adhesive surface area with the sealing material 209.

The package 212 may be integrally formed with the external electrodes, or can be divided into a plurality of parts and then assembled. The external electrodes are ideally produced by, for example, metal plating, solder plating, etc. silver, copper, palladium, gold, tungsten or the like onto a surface of copper, phosphor bronze, or the like. This type of package 212 can be formed comparatively simply by insert molding or the like. A resin such as polycarbonate resin, polyphenylene sulfide (PPS), liquid crystal polymer (LCP), ABS resin, epoxy resin, phenol resin, acryl resin, PBT resin, and the like, a ceramic, a metal, and the like can be employed as the package material. Particularly in the case of metal, even if a light emitting device is used at a high output that employs an LED chip that emits light including ultraviolet light, deterioration due to the ultraviolet light, yellowing, a reduction in light emission efficiency, and a reduction in mechanical strength, will not occur, and the lifespan of the light emitting device can be improved. In addition, various dyes and pigments such as $Cr_2O_3$, $MnO_2$, $Fe_2O_3$, carbon black, and the like can be employed as a coloring agent that will darken the color of the package.

Note that the wires 210 are not particularly limited, but a metal such as, for example, gold, copper, platinum, aluminum, and the like and alloys thereof are preferably employed, and it is preferable for the diameter thereof to be about 10 to 70 μm.

In addition, the sealing material 209 is provided in order to protect the LED chip 200, the wires 210, and optionally, a coating layer in which a fluorescent material is included in accordance with their use in the light emitting device, or in order to improve the light extraction efficiency. The sealing material 209 ideally employed is a transparent resin with superior weather resistance, such as epoxy resin, urea resin, silicone resin, fluororesin, and the like, glass, or the like. By including a dispersion agent in the mold material, directionality from the LED chip 200 can be reduced, and the angle of visibility can be increased. Note that when a metal package is used, and the LED chip 200 is hermetically sealed together with nitrogen gas, the mold material is not essential.

Note that the packaging material and the like described above may be employed in any of the examples of the present invention, and with a light emitting device in which an indentation is provided in a base made of metal, the light emitting element is mounted, the leads discretely insulated from the base are electrically connected, and hermetic sealing is performed, the LED chip may be directly mounted in the indentation on the metal substrate as in COB assembly. In addition, the light emitting device may have a plurality of devices stacked together and mounted on one mounting base or inside one indentation, may have a plurality of bases on which a light emitting element is mounted and which form one device base, or the like.

EXAMPLE 18

Figure 19:
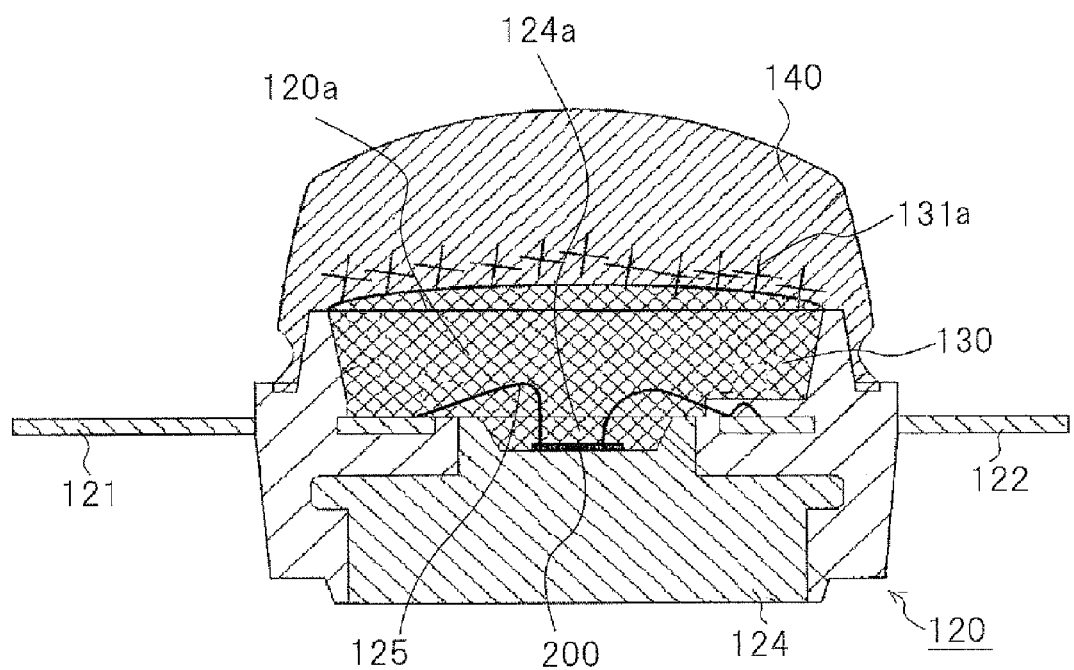
FIG. 19 is a cross-section of another light emitting device which employs the semiconductor light emitting element according to Example 18 of the present invention.

In this example, as shown in FIG. 19, an LED chip 200 that is the semiconductor light emitting element having the diffusion line electrodes and the n-line electrodes shown in Example 13, formed a light emitting device by means of face up mounting inside an indentation 120a of a stem 120.

The stem 120 employs a thermoplastic resin (polyphthalamide) to integrally mold a heat sink 124 formed by performing Ag plating on Cu, a first lead 121, and a second lead 122. The heat sink 124 includes an indentation 24a on the upper surface thereof, and an opening in the upper portion thereof has a wide-mouth, approximate truncated pyramid shape. In this way, light from the LED chip 200 can be reflected with good efficiency, and the light extraction efficiency can be improved.

The LED chip 200 is die bonded in the approximate center of the indentation 124a of the heat sink 124 by means of an adhesive layer composed of epoxy resin. In addition, positive and negative electrodes on the upper surface of the LED chip 200 are respectively die bonded to the first lead 121 and the second lead 122 by means of an Au wire 125.

A first silicone resin 130 (e.g., coefficient of viscosity of 1.93 Pa·s (23° C.), manufactured by Shin-Etsu Chemical) is injected into the indentation 120a of the stem on which the LED chip 200 is mounted, so that air will not enter, and such that the upper surface thereof will bulge slightly upward. In addition, a second silicone resin 140 (e.g., coefficient of viscosity of 5.2 Pa·s (23° C.), manufactured by Shin-Etsu Chemical) is injected on top of the first silicone resin 130 such that the first silicone resin 130 and a portion of the outer side of the stem 120 are covered. Note that an interface 131a between the first silicone resin 130 and the second silicone resin 140 has a composition gradient, and the unreacted portion of the first silicone resin will react with the hardened portion of the second silicone resin.

This type of light emitting device can both protect the light emitting element from external damage, and improve light extraction efficiency.

EXAMPLE 19

Figure 20:
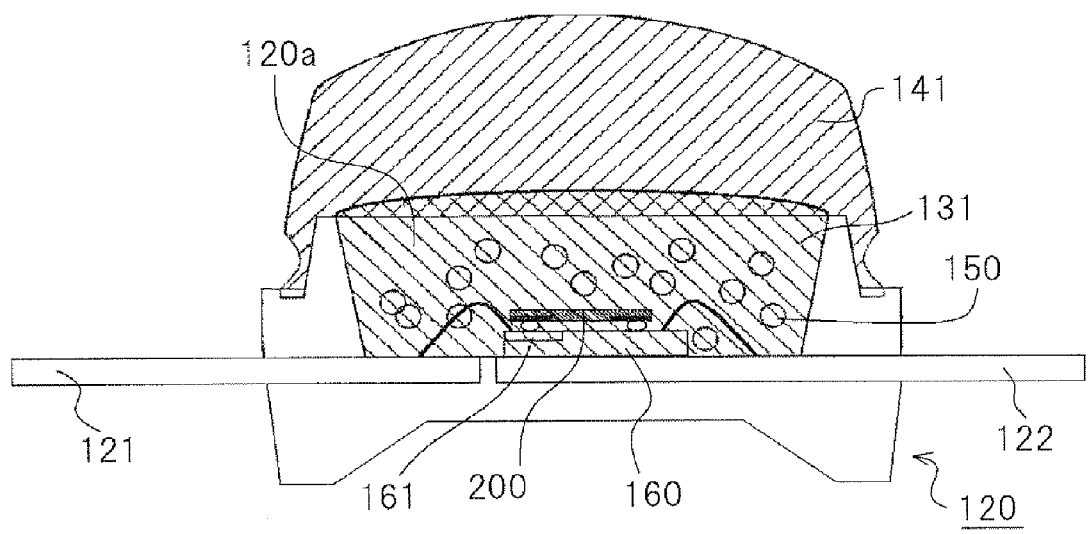
FIG. 20 is a cross-section of a light emitting device which employs the semiconductor light emitting element according to Example 19 of the present invention.

In this example, as shown in FIG. 20, an LED chip 200 that is the semiconductor light emitting element having the diffusion line electrodes and the n-line electrodes shown in Example 13, formed a light emitting device by means of flip chip mounting inside an indentation 120a of a stem 120 via a submount member 160.

The stem 120 integrally molds a first lead 121 and a second lead 122 together by means of a resin, and a portion of the ends of the first lead 121 and the second lead 122 are exposed inside the indentation 120a of the stem. The submount member 160 is mounted on the exposed second lead 122. An LED chip 200 is mounted in the approximate center of the indentation 120a, and on top of the submount member 160. An electrode 161 arranged on the submount member 160 is electrically connected to the first lead via a wire, and an electrode 62 is electrically connected to the second lead via a wire.

A sealing material 131 that includes a fluorescent material 150 is embedded in the indentation of the stem, and on top thereof, a sealing material 141 covers the sealing material 131 and a portion of the stem 120.

Note that in this light emitting device, the LED chip 200 may be directly mounted to the leads and not via the submount, and an ultrasonic wave vibration device may be employed to perform bonding via lead free solder bumps and electrically connect the LED chip 200.

EXAMPLE 20

Figure 21:
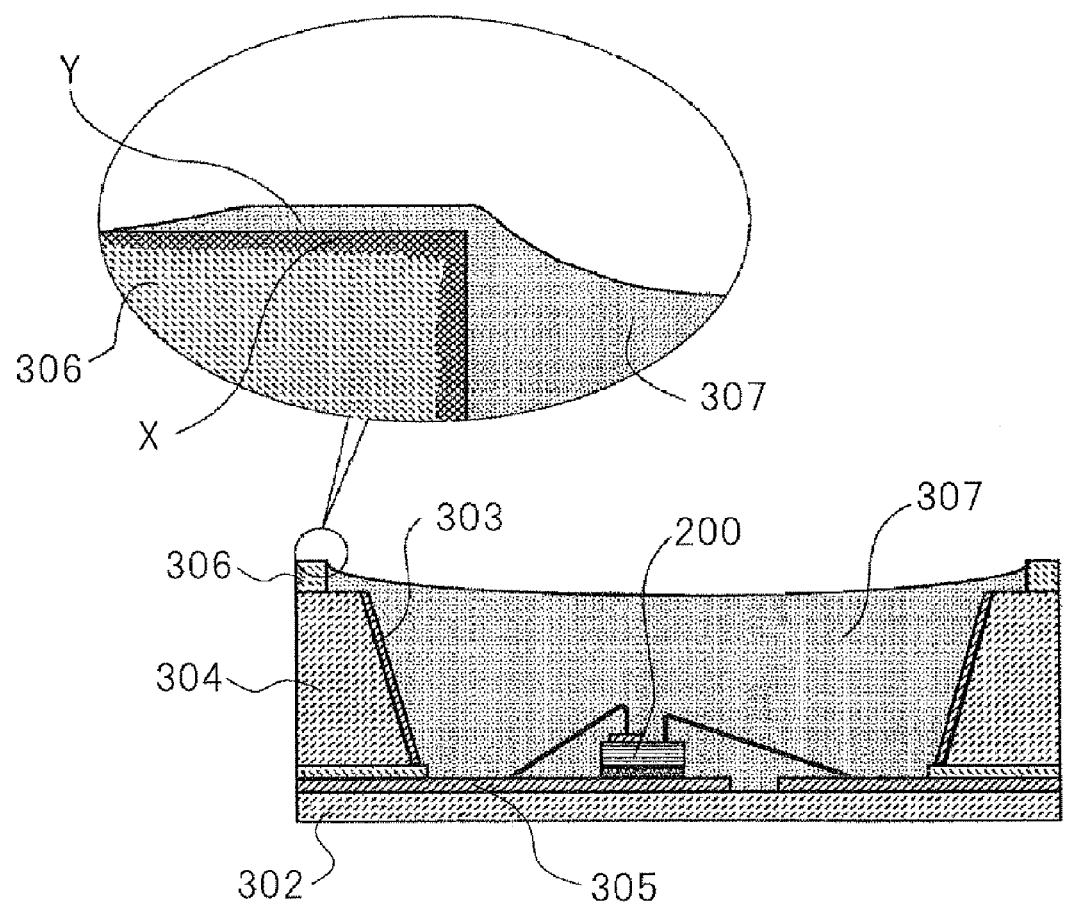
FIG. 21 is a cross-section and a partially enlarged view of another light emitting device which employs the semiconductor light emitting element according to Example 20 of the present invention.

In this example, as shown in FIG. 21, an LED chip 200 that is the semiconductor light emitting element shown in Example 16, was formed into a light emitting device by means of face up mounting inside a ceramic package.

The ceramic package includes at least a ceramic base 302 that will become a substrate, and a ceramic base 304 having a through hole in which the shape of the inner wall surface thereof widens toward the opening. On the ceramic base 302 that will become the substrate, a conductive wire 305 for supplying electric power to the LED chip 200 extends from the bottom surface of the indentation of the package through the ceramic bases 302, 304, and to the outer wall surface of the light emitting device.

The inner wall surface of the ceramic base that is shaped to widen toward the opening forms an indentation of the package, a light reflection portion 303 is arranged on the inner wall surface of the indentation, and a sealing material 307 is embedded in the indentation.

Figure 22:
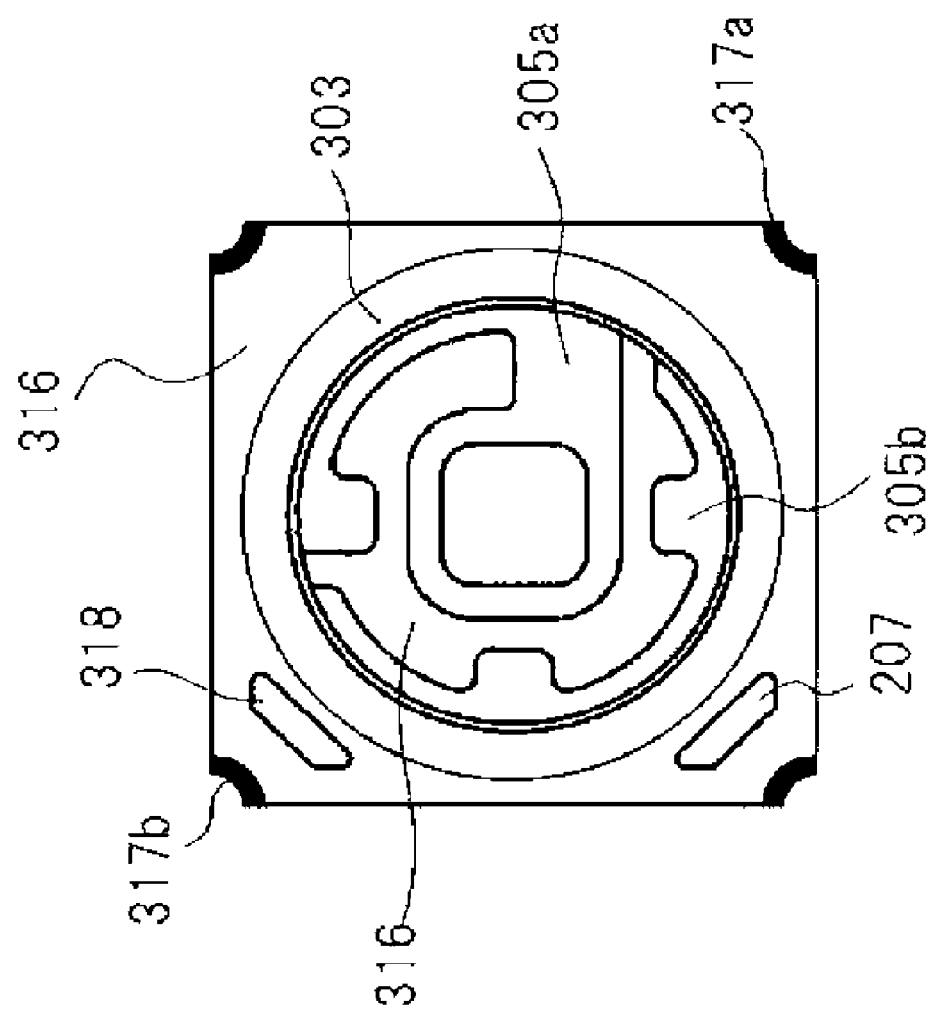
FIG. 22 is a plan view of a ceramic package which employs the light emitting device of FIG. 21.

In other words, as shown in FIG. 22, the ceramic package includes an indentation for mounting an LED chip. A pair of positive and negative conductive wires 305a, 305b are provided on the bottom surface of the indentation, and a ceramic base 316 is exposed to discretely insulate the pair of positive and negative conductive wires. The LED chip is mounted in the center of the bottom surface of the indentation in which the ceramic is exposed, and a portion of the conductive wire 305a is patterned so as to surround the LED chip. Here, when the transparent substrate side of an LED chip (a semiconductor mounted on a transparent substrate such as a sapphire substrate) is fixed to face the bottom surface of the indentation, it is preferable that the transparent substrate be covered with a metal having a high reflectance such as Al, Ag, and alloys thereof. By forming the light emitting device in this way, light transmitted through the ceramic will be reflected toward the light emission observation surface, and thus the light extraction efficiency of the light emitting device can be improved. Another semiconductor element such as a protective element can be mounted on the conductive wires. In addition, the pair of positive and negative conductive wires 305a, 305b and a pair of positive and negative conductive wires 317a, 317b that connect thereto are exposed on the ends of the side surfaces of the ceramic package.

Note that a pair of marks 318 that indicate the position of the cathode on the main surface of the light emission observation surface side of the ceramic package, are printed in the corners of the main surface of the light emission observation surface side. The pair of marks 318 that indicate the position of the cathode can be formed by printing a resin paste containing tungsten onto a ceramic green sheet and then sintering the same.

Thus, by mounting the LED chip on a ceramic package, not only will electric power efficiency improve, but the heat dissipation and thermal resistance will be superior to a package made from plastic, and a light emitting device can be provided in which the LED chip mounted thereon is capable of emitting light for a long period of time and with high luminosity.

The conductive wire 305 and the light reflection portion 303 are formed by coating a resin paste (coefficient of viscosity of 30000 ps) containing sintered tungsten (average particle diameter of about 1 µm) with Ag.

The LED chip 200 is fixed to the surface of the conductive wire 305 embedded in the bottom surface of the indentation of the package, via an insulating adhesive.

This type of light emitting device can be formed as follows.

First, a green sheet having alumina as the primary component is cut to a predetermined size to form a portion of the ceramic base 302. Furthermore, a resin paste containing tungsten is screen printed along a pattern of the conductive wire 305.

In addition, a green sheet having a through hole of a size that will allow the LED chip to be accommodated therein, and a green sheet having a through hole whose inner diameter widens toward one opening, are formed. Furthermore, the green sheets formed will have a resin paste containing tungsten screen printed along a pattern of the light reflection portion 303, and will become the ceramic base 304.

The plurality of green sheets thus formed will be stacked in a state in which the centers of the through holes are aligned, and will be heat pressed in a vacuum to temporarily form the indentation of the package.

A punching machine will be used to form through holes of 0.3 mφ with a standard method. Here, at least a pair of positive and negative through holes are formed, and are formed so as to correspond to two positive and negative through holes. Next, a resin paste containing tungsten is embedded into the through holes by screen printing, and a portion is printed that will become a conductive wire 306 that is exposed on the outer wall surface of the ceramic package.

Grooves will be formed along a predetermined pattern in one of the main surfaces of the laminated green sheets. Here, the grooves are formed in a matrix shape along the lines that connect the centers of the through holes, so that the indentation is included between the grooves in the long direction of the ceramic substrate and the grooves in the short direction. After groove formation, the ceramic substrate will be formed by sintering. At this time, the portions on which the resin paste containing tungsten will become a first metal layer. Next, a Ni/Ag multi-layer film will be electrically plated as a second metal layer on the exposed surfaces of the first metal layer. In this way, the light reflection portion 303 and the conductive wire 305 will be formed, and a ceramic substrate having an opening diameter of 2.0 mmφ, and an opening depth of 0.8 mm, will be obtained.

On the other hand, the LED chip 200 is formed with the electrodes shown in Example 16, and is composed of a InGaN semiconductor layer having a primary light emission peak at 450 nm. In other words, the LED chip is formed by flowing TMG (trimethyl gallium) gas, TMI (trimethyl indium) gas, nitrogen gas, and dopant gas together with a carrier gas onto a clean sapphire substrate, and forming a gallium nitride compound semiconductor with the MOCVD method. By switching between $SiH_4$ and $Cp_2Mg$ as the dopant gas, a gallium nitride semiconductor having n-type conductivity and a gallium nitride semiconductor having p-type conductivity will be formed, and a p-n connection will be formed. (Note that the p-type semiconductor is annealed at 400° C. or greater after sintering.)

After each p-n semiconductor surface is exposed by etching, each electrode of the pattern shown in FIG. 16 will be formed by sputtering. After scribe lines are scratched in the semiconductor wafer obtained as above, the wafer will be divided by an external force to produce an LED chips as the light emitting element. After an LED chip capable of emitting blue light is die bonded with epoxy resin to a predetermined location on the bottom of the indentation of the ceramic package, it will be fixed by heat curing. After that, metal wire will be employed as conductive wire, and each electrode of the LED chip will be electrically connected to the conductive wire by wire bonding. A silicone resin is injected as a sealing material inside the indentation of the ceramic substrate in which the LED chip is mounted. Here, the silicone resin is injected to the vicinity of the upper surface of the side walls of the indentation of the ceramic package that form the indentation, and is then cured. In addition, a portion of the silicon resin will either impregnate into the interior of the side walls of the ceramic when hardened, or will creep up to the upper surface and then harden. For example, viewed from the light emission observation surface direction, a portion of the silicone resin, as shown in FIG. 21, will spread across the entire periphery of the indentation, and up to the ceramic portion of the upper surface of the indentation side walls. Although the condition of the spread out portion will be different depending upon the coefficient of viscosity of the silicone resin and the degree of ceramic sintering, for example, as shown by the spread out portion Y in the enlarged cross-section of FIG. 21, the silicone resin has crept up from the indentation to the upper surface of the light emission observation surface side walls that form the indentation. In addition, a portion of the silicone resin is impregnated in the porous ceramic that forms the side walls. Although the condition of the portion that is impregnated will be different depending upon the coefficient of viscosity of the silicone resin and the degree of ceramic sintering, for example, the impregnated portion X is shown in the enlarged cross-section of FIG. 21.

The silicone resin will impregnate into the ceramic base 306 that is the main surface of the light emission observation surface of the ceramic package, or will spread out from the indentation. The light emitting device obtained in this example is mounted with solder on a substrate on which a conductive pattern is provided, via a so-called reflow process. However, by forming silicone resin on the spread out portion Y, and by impregnating silicone resin into the ceramic substrate, solder that is placed on the mounting surface side during reflow will be prevented from creeping up in the light emitting surface direction by the silicone resin on the main surface of the light emission observation surface side, and thus solder will not come into contact with each other, and solder will not cover the opening of the ceramic package indentation. Thus, the light emitting device can connect to an external mounting substrate with high reliability.

EXAMPLE 21

Figure 23:
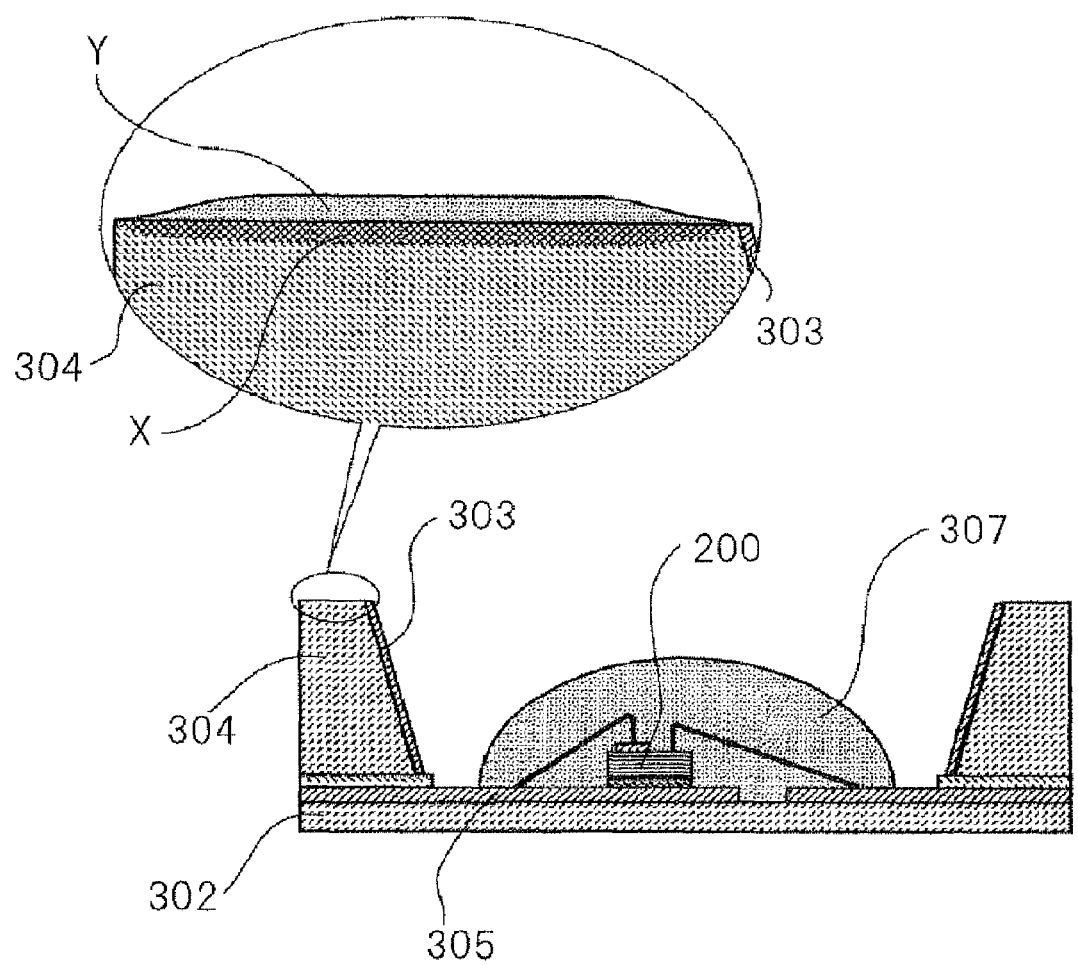
FIG. 23 is a cross-section and a partially enlarged view of another light emitting device which employs the semiconductor light emitting element according to Example 21 of the present invention.

As shown in FIG. 23, this light emitting device is substantially identical with that of Example 20, except that the sealing material 307 does not cover the light reflection portion 303, and is formed so as to cover at least the LED chip 200.

In this case also, as shown by the spread out portion Y in the enlarged cross-section of FIG. 23, as shown by the spread out portion Y in the enlarged cross-section of FIG. 21, the silicone resin is formed to cover the upper surface of the indentation side walls of the ceramic package, and a portion of the silicone resin is impregnated in the ceramic substrate 304 that forms the upper surface of the indentation side walls, and thus forms the impregnated portion X.

Note that in this light emitting device, the sealing material may contain a fluorescent substance.

The fluorescent substance is coprecipitated with oxalic acid from a solution in which a stoichiometric ratio of the rare earth elements Y, Gd, and Ce are dissolved with acid. The fluorescent substance is then sintered, and the coprecipitated oxide thus obtained is mixed with aluminum oxide to obtain a mixed compound. Barium fluoride is mixed therein as a flux, and then is packed into a crucible, and sintered in the presence of air at 1400° C. for three hours to obtain a sintered product. The sintered product is then processed in a ball mill in the presence of water, and a $(Y_{0.005}Gd_{0.005})_{2.750}Al_5O_{12}:Ce_{0.250}$ fluorescent material having a centric particle diameter of 8 μm will be formed via washing, separating, drying, and finally sieving.

The silicone resin compound (refractive index 1.52) contains 5.5 wt % of the aforementioned fluorescent substance (refractive index 1.84), and is mixed in a rotary mixer for 5 minutes. The curable compound thus obtained is filled into the indentation of the ceramic package. Finally, heat treatment is performed for 2 hours at 70° C. and 1 hour at 150° C. In this way, a light emitting device can be provided that is capable of emitting light that is a mixture of the emitted light from the light emitting element, and the fluorescent light due to the fluorescent substance that absorbs the emitted light and which emits light having different wavelengths. In particular, by adding a fluorescent material to the sealing material 307 in FIG. 23, the light reflection portion 303 can reflect the mixed light with good efficiency in the direction of the light emission observation surface.

EXAMPLE 22

A light emitting device substantially identical to that in Example 1 was produced, except that 4 cc of TMG, 3.0 liters of ammonia, and 2.5 liters of hydrogen gas as a carrier gas were conducted at 900° C. and in a hydrogen atmosphere to the top of a p-type semiconductor layer, and a p-type contact layer was grown that was 250 Å in thickness and composed of p-type GaN doped with $1.5 \times 10^{20}/cm^3$ of Mg on top of a p-type clad layer. The surface of the contact layer was then polished, and the RMS surface roughness of the surface was adjusted to about 3.

In this way, not only were the same effects as those of the light emitting device of Example 1 confirmed, but it was also confirmed that Vf declined even more, and the inner surface distribution was stable.

INDUSTRIAL APPLICABILITY

The semiconductor light emitting element of the present invention can be ideally used to form various types of light sources, such as backlights, displays, lighting, automobile headlights, and the like.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A semiconductor light emitting element comprising a conductive oxide film contacting a semiconductor layer, the conductive oxide film containing at least one element selected from the group consisting of zinc, indium, tin, and magnesium as a constituent element; wherein the conductive oxide film has a plurality of voids in the vicinity of the interface with the semiconductor layer with each of the voids forming an open space between the conductive oxide film and the semiconductor layer.

2. The semiconductor light emitting element of claim 1, wherein the density of the conductive oxide film is lower on the semiconductor layer side than on the surface side.

3. The semiconductor light emitting element of claim 1, wherein the conductive oxide film does not have voids on the surface side.

4. The semiconductor light emitting element of claim 1, wherein the surface side of the conductive oxide film is flat.

5. A semiconductor light emitting element comprising a conductive oxide film contacting a semiconductor layer, the conductive oxide film containing at least one element selected from the group consisting of zinc, indium, tin, and magnesium as a constituent element; wherein the conductive oxide film has pits and/or projections on the surface of the semiconductor layer side, the projections are in contact with the semiconductor layer while the pits are not in contact with the semiconductor layer, the pits constitute voids therein with each of the voids forming an open space between the conductive oxide film and the semiconductor layer, and the surface opposite the semiconductor layer side is flat.

6. The semiconductor light emitting element of claim 1, wherein the conductive oxide film is an oxide film further comprising a trace amount of an element different than the constituent element.

7. The semiconductor light emitting element of claim 5, wherein the conductive oxide film is an oxide film further comprising a trace amount of an element different than the constituent element.

8. The semiconductor light emitting element of claim 6, wherein the trace element is at least one element selected from tin, zinc, gallium, and aluminum.

9. The semiconductor light emitting element of claim 6, wherein the oxide film contains the trace element in an amount 20% or less of the constituent element other than oxygen.

10. The semiconductor light emitting element of claim 8, wherein the concentration of the trace element of the conductive oxide film in the vicinity of the interface with the semiconductor layer is higher than the concentration of the trace element in the vicinity of the surface opposite the interface.

11. The semiconductor light emitting element of claim 8, wherein the concentration of the trace element of the conductive oxide film steadily decreases from the semiconductor layer side surface to the opposite surface.

12. The semiconductor light emitting element of claim 1, wherein the conductive oxide film is an ITO film.

13. The semiconductor light emitting element of claim 5, wherein the conductive oxide film is an ITO film.

14. The semiconductor light emitting element of claim 1, wherein the light transmissivity of the conductive oxide film with respect to a light with a wavelength in a range of 400 nm to 600 nm is 80% or greater.

15. The semiconductor light emitting element of claim 5, wherein the light transmissivity of the conductive oxide film with respect to a light with a wavelength in a range of 400 nm to 600 nm is 80% or greater.

16. The semiconductor light emitting element of claim 1, wherein the specific resistance of the conductive oxide film is $1 \times 10^{-4} \Omega cm$ or less.

17. The semiconductor tight emitting element of claim 5, wherein the specific resistance of the conductive oxide film is $1 \times 10^{-4} \Omega cm$ or less.

18. The semiconductor light emitting element of claim 1, wherein the thickness of the conductive oxide film is 100 nm or greater.

19. The semiconductor light emitting element of claim 5, wherein the thickness of the conductive oxide film is 100 nm or greater.

20. The semiconductor light emitting element of claim 1, wherein the plurality of voids make up 10 to 50% of the entire thickness of the conductive oxide film from the semiconductor layer side.

21. The semiconductor light emitting element of claim 5, wherein the plurality of voids make up 10 to 50% of the entire thickness of the conductive oxide film from the semiconductor layer side.

22. The semiconductor tight emitting element of claim 1, wherein the semiconductor light emitting element is formed by laminating a first conductive type semiconductor layer, a tight emitting layer, and a second conductive type semiconductor layer in this order; electrodes are respectively connected to the first conductive type and second conductive type semiconductor layers; and the conductive oxide layer is formed on at least the second conductive type semiconductor layer.

23. The semiconductor light emitting element of claim 5, wherein the semiconductor light emitting element is formed by laminating a first conductive type semiconductor layer, a light emitting layer, and a second conductive type semiconductor layer in this order; electrodes are respectively connected to the first conductive type and second conductive type semiconductor layers; and the conductive oxide layer is formed on at least the second conductive type semiconductor layer.

24. The semiconductor light emitting element of claim 20, wherein the first conductive type semiconductor layer is an n-type semiconductor layer, and the second conductive type semiconductor layer is a p-type semiconductor layer.

25. The semiconductor light emitting element of claim 1, wherein the semiconductor light emitting element is formed by laminating a first conductive type semiconductor layer, a light emitting layer, and a second conductive type semiconductor layer in this order; electrodes are respectively connected to the first conductive type and second conductive type semiconductor layers; and the first conductive type semiconductor layer is an n-type nitride semiconductor layer, the second conductive type semiconductor layer is a p-type nitride semiconductor layer, and the p-type nitride semiconductor layer is in contact with the conductive oxide film as a p-type contact layer and has a thickness of 250 Å or less and an Mg concentration of $1.5 \times 10^{20}/cm^3$ or greater.

26. The semiconductor light emitting element of claim 5, wherein the semiconductor light emitting element is formed by laminating a first conductive type semiconductor layer, a light emitting layer, and a second conductive type semiconductor layer in this order; electrodes are respectively connected to the first conductive type and second conductive type semiconductor layers; and the first conductive type semiconductor layer is an n-type nitride semiconductor layer, the second conductive type semiconductor layer is a p-type nitride semiconductor layer, and the p-type nitride semiconductor layer is in contact with the conductive oxide film as a p-type contact layer and has a thickness of 250 Å or less and an Mg concentration of $1.5 \times 10^{20}/cm^3$ or greater.

27. The semiconductor light emitting element of claim 26, wherein the surface of the p-type contact layer has an RMS surface roughness of 3 nm or less.

28. The semiconductor light emitting element of claim 1, wherein a metal film is formed on the conductive oxide layer.

29. The semiconductor light emitting element of claim 5, wherein a metal film is formed on the conductive oxide layer.

30. The semiconductor light emitting element of claim 27, wherein the metal film is formed by a single layer film or a laminated film or an alloy of W, Rh, Ag, Pt, Pd, Al or Ti.

31. The semiconductor light emitting element of claim 1, wherein the semiconductor layer is a nitride semiconductor layer.

32. The semiconductor light emitting element of claim 5, wherein the semiconductor layer is a nitride semiconductor layer.

33. A method of producing a semiconductor light emitting element comprising a conductive oxide film contacting a semiconductor layer, and the conductive oxide film containing at least one element selected from the group consisting of zinc, indium, tin, and magnesium, the method comprising the steps of: (1) forming a conductive oxide film having voids from the semiconductor layer side to the surface with each of the voids forming an open space between the conductive oxide film and the semiconductor layer; and (2) forming a conductive oxide layer on the conductive oxide film obtained in step (1) which has no voids or fewer voids than that of step (1).

34. The method of claim 33, wherein the conductive oxide film is an oxide film containing at least one element selected from the group comprising zinc, indium, tin, and magnesium, and a trace element that is different from the constituent element.

35. The method of claim 34, wherein the trace element is at least one element selected from tin, zinc, gallium, and aluminum.

36. The method of claim 33, wherein the conductive oxide film is an ITO film.

37. The method of claim 33, wherein the voids make up 10 to 50% of the entire thickness of the conductive oxide film from the semiconductor layer side.

38. The method of claim 33, wherein the semiconductor layer is a nitride semiconductor.

39. The method of claim 33, wherein the semiconductor layer is a p-type nitride semiconductor.

40. A semiconductor light emitting element comprising a conductive oxide film contacting a semiconductor layer with the conductive oxide film directly contacting the semiconductor layer, the conductive oxide film containing at least one element selected from the group consisting of zinc, indium, tin, and magnesium as a constituent element; wherein a surface of the conductive oxide film that faces the semiconductor layer is porous, the surface of the conductive oxide film is in contact with the semiconductor layer with a plurality of voids being interposed between the conductive oxide film and the semiconductor layer, each of the voids forms an open space, and a surface of the semiconductor layer that faces the conductive oxide film is smoother than the surface of the conductive oxide film that faces the semiconductor layer.

41. The semiconductor light emitting element of claim 40, wherein the conductive oxide film is an ITO film.

42. The semiconductor light emitting element of claim 40, wherein the semiconductor light emitting element is formed by laminating a first conductive type semiconductor layer, a light emitting layer, and a second conductive type semiconductor layer in this order; electrodes are respectively connected to the first conductive type and second conductive type semiconductor layers; and the first conductive type semiconductor layer is an n-type nitride semiconductor layer, the second conductive type semiconductor layer is a p-type nitride semiconductor layer, and the p-type nitride semiconductor layer is in contact with the conductive oxide film as a p-type contact layer and has a thickness of 250 Å or less and an Mg concentration of $1.5 \times 10^{20}/cm^3$ or greater.

* * * * *